US012581941B2

(12) United States Patent
Huang et al.

(10) Patent No.: US 12,581,941 B2
(45) Date of Patent: Mar. 17, 2026

(54) SEMICONDUCTOR DEVICE AND METHOD OF FORMING THEREOF

(71) Applicant: Taiwan Semiconductor Manufacturing Co., Ltd., Hsinchu (TW)

(72) Inventors: Yen-Chih Huang, Hsinchu (TW); Li-An Sun, Hsinchu (TW); Che-En Tsai, Hsinchu (TW); Yu-Lin Chiang, Hsinchu (TW); Chung Chuan Huang, Hsinchu (TW); Chih-Hao Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 201 days.

(21) Appl. No.: 18/302,182

(22) Filed: Apr. 18, 2023

(65) Prior Publication Data

US 2023/0253321 A1 Aug. 10, 2023

Related U.S. Application Data

(62) Division of application No. 17/318,327, filed on May 12, 2021, now Pat. No. 11,652,049.

(Continued)

(51) Int. Cl.
| | |
|---|---|
| *H01L 23/528* | (2006.01) |
| *H01L 21/768* | (2006.01) |
| *H01L 23/535* | (2006.01) |

(52) U.S. Cl.
CPC .... *H01L 23/5283* (2013.01); *H01L 21/76805* (2013.01); *H01L 21/76816* (2013.01);
(Continued)

(58) Field of Classification Search
CPC .......... H01L 23/5283; H01L 21/76805; H01L 21/76816; H01L 21/76843;
(Continued)

(56) References Cited

U.S. PATENT DOCUMENTS 6,368,967 B1 * 4/2002 Besser .............. H01L 21/76877
438/626
6,656,830 B1 12/2003 Subramanian et al.
(Continued)

FOREIGN PATENT DOCUMENTS

| CN | 101740474 A | 6/2010 |
|---|---|---|
| CN | 111180384 A | 5/2020 |

(Continued)

*Primary Examiner* — Sue A Purvis
(74) *Attorney, Agent, or Firm* — Slater Matsil, LLP

(57) ABSTRACT

A method includes forming a first etch stop layer (ESL) over a conductive feature, forming a first dielectric layer on the first ESL, forming a second ESL on the first dielectric layer, forming a second dielectric layer on the second ESL, forming a trench in the second dielectric layer, forming a first opening in a bottom surface of the trench extending through the second dielectric layer, and forming a second opening in a bottom surface of the first opening. The second opening extends through the first dielectric layer and the first ESL. The second opening exposes a top surface of the conductive feature. The method further includes widening the first opening to a second width, filling the trench with a conductive material to form a conductive line, and filling the second opening and the first opening with the conductive material to form a conductive via.

20 Claims, 33 Drawing Sheets

Related U.S. Application Data

(60) Provisional application No. 63/159,004, filed on Mar. 10, 2021.

(52) U.S. Cl.
CPC .. *H01L 21/76843* (2013.01); *H01L 21/76895* (2013.01); *H01L 23/535* (2013.01)

(58) Field of Classification Search
CPC ............. H01L 21/76895; H01L 23/535; H01L 21/76813; H01L 21/76804; H01L 21/76832; H01L 21/76834; H01L 21/76807; H01L 21/76829; H01L 21/76877; H01L 21/7681; H01L 23/5226; H01L 23/53295
See application file for complete search history.

(56) References Cited

U.S. PATENT DOCUMENTS

| | | | |
|---|---|---|---|
| 6,768,204 | B1 | 7/2004 | Lukanc et al. |
| 10,796,955 | B2 | 10/2020 | Chang et al. |
| 11,063,111 | B2 | 7/2021 | Wu |
| 11,094,626 | B2 | 8/2021 | Lee et al. |
| 2005/0001323 | A1 | 1/2005 | Watannabe et al. |
| 2005/0245026 | A1 | 11/2005 | Kim et al. |
| 2006/0131756 | A1 | 6/2006 | Bae |
| 2007/0126121 | A1 | 6/2007 | Shue et al. |
| 2010/0164121 | A1 | 7/2010 | Feustel et al. |
| 2011/0183518 | A1 | 7/2011 | Usami |
| 2014/0117558 | A1 | 5/2014 | Boyanov |
| 2015/0348917 | A1 | 12/2015 | Tsai et al. |
| 2017/0140979 | A1 | 5/2017 | Lin |
| 2017/0178951 | A1* | 6/2017 | Ting ................. H01L 21/76829 |
| 2019/0035734 | A1 | 1/2019 | Ho et al. |
| 2019/0043804 | A1 | 2/2019 | Qian et al. |
| 2019/0157139 | A1* | 5/2019 | Cheng .............. H01L 23/53295 |
| 2019/0164813 | A1 | 5/2019 | Wang et al. |
| 2020/0051909 | A1 | 2/2020 | Kim et al. |
| 2020/0083093 | A1 | 3/2020 | Liu et al. |
| 2020/0083094 | A1 | 3/2020 | Ding et al. |
| 2020/0135557 | A1 | 4/2020 | Huang et al. |
| 2021/0035906 | A1 | 2/2021 | Chen et al. |

FOREIGN PATENT DOCUMENTS

| | | |
|---|---|---|
| CN | 112309964 A | 2/2021 |
| DE | 102008063430 A1 | 7/2010 |
| DE | 102017127530 A1 | 1/2019 |
| KR | 20030023299 A | 3/2003 |
| KR | 20190013227 A | 2/2019 |
| KR | 20190013413 A | 2/2019 |
| KR | 20190064376 A | 6/2019 |
| KR | 20200016472 A | 2/2020 |
| KR | 20200029835 A | 3/2020 |
| TW | 201644054 A | 12/2016 |
| TW | 202013752 A | 4/2020 |
| TW | 202025388 A | 7/2020 |

* cited by examiner

101

Cross-Section A-A'

Cross-Section B-B'

Cross-Section A-A'

Cross-Section A-A'

Cross-Section A-A'

Cross-Section B-B'

Cross-Section C-C'

101

200

170   160   150   140   130   120   108N

Cross-Section A-A'

Cross-Section A-A'

Cross-Section B-B'

101

170

160

150

140
130

120

108N

200

202

212

Cross-Section C-C'

101

200

170 160 150 140 130 120 108N

Cross-Section A-A'

101

160
150
140
130
120
110N

200 / W4
204 / W3
W2
W1
214
108N
108N
108N

T5

Cross-Section C-C'

101

200

170

160

150

140
130

120

108N

Cross-Section A-A'

101

200

204

214

108N

108N

108N

160

150

140
130

120

110N

Cross-Section A-A'

Cross-Section B-B'

101

200

204

214

220
170
160
150
140
130
120
108N

Cross-Section C-C'

101

200

220
170
160
150
140
130
120
108N

Cross-Section B-B'

101

250 220 170 160 150 140 130 120 108N

Cross-Section C-C'

101

250
220
170
160
150
140
130
120
108N

Cross-Section A-A'

Cross-Section B-B'

Cross-Section A-A'

Cross-Section A-A'

Cross-Section A-A'

SEMICONDUCTOR DEVICE AND METHOD OF FORMING THEREOF

PRIORITY CLAIM AND CROSS-REFERENCE

This application is a divisional of U.S. patent application Ser. No. 17/318,327, filed on May 12, 2021, now U.S. Pat. No. 11,652,049, issued May 16, 2023, which claims the benefit of U.S. Provisional Application No. 63/159,004, filed on Mar. 10, 2021, each application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
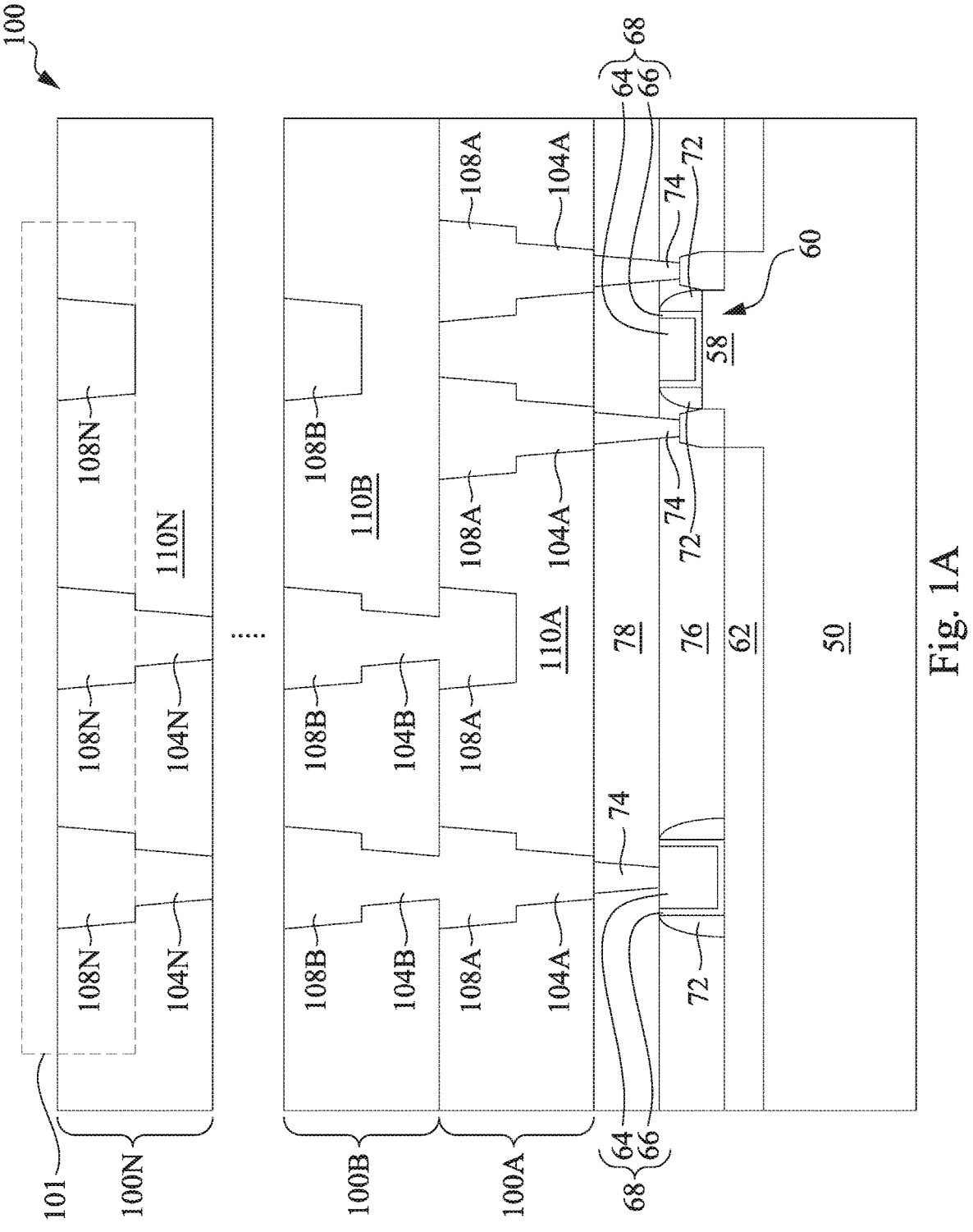
FIG. 1A illustrates a cross-sectional view of a semiconductor substrate and interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure includes, for example, embodiments of interconnect structures with conductive vias having two step structures and methods of forming thereof. Via resistance may increase as via bottom widths are made smaller, e.g., below 20 nm, in advanced technology nodes. The two step via structures have portions of the vias with increased widths which increase the via volumes to reduce via resistance while keeping the contact areas small to reduce bridging. The two step via structures also enable larger via faceting which improves the metal filling of the vias for better connection between conductive layers.

Figure 1B:
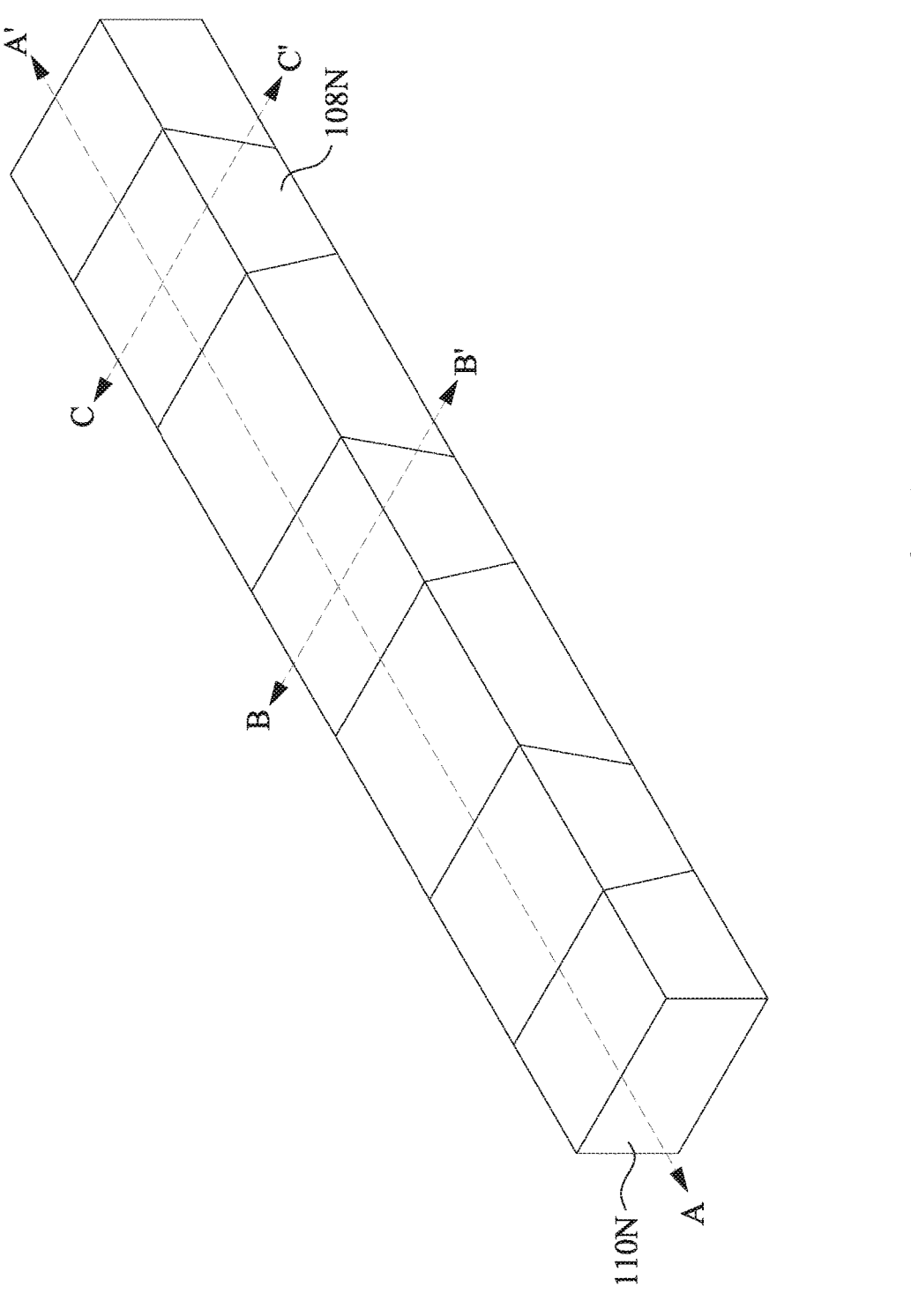
FIG. 1B illustrates a perspective view of an interconnect structure at an intermediate stage of manufacturing, in accordance with some embodiments.

FIG. 1A illustrates a cross-sectional view of a semiconductor structure 100 comprising a substrate 50 in which various electronic devices may be formed, and a portion of a multilevel interconnect system (e.g., layers 100A and 100B) formed over the substrate 50, in accordance with some embodiments. FIG. 1B illustrates a perspective view of region 101 as shown in FIG. 1A. Generally, as will be discussed in greater detail below, FIG. 1A illustrates a FinFET device 60 formed on a substrate 50, with multiple interconnection layers formed thereover.

Generally, the substrate 50 illustrated in FIG. 1A may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multilayered substrates, gradient substrates, or hybrid orientation substrates.

The FinFET device 60 illustrated in FIG. 1A is a three-dimensional MOSFET structure formed in fin-like strips of semiconductor protrusions 58 referred to as fins. The cross-section shown in FIG. 1A is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1A illustrates a single fin 58, although the substrate 50 may comprise any number of fins.

Shallow trench isolation (STI) regions 62 formed along opposing sidewalls of the fin 58 are illustrated in FIG. 1A. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner (not shown) such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fin 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1A is a high-k, metal gate (HKMG) gate structure that may be formed using a gate-last process flow (sometimes referred to as a replacement gate process flow). In a gate-last process flow a sacrificial dummy gate structure (not shown) is formed after forming the STI regions 62. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the high-k metal gate (HKMG) gate structure 68 as illustrated in FIG. 1A. The HKMG gate structure 68 illustrated in the right side in FIG. 1A (seen on the top of fin 58) is an example of an active HKMG gate structure which extends, e.g., along sidewalls of and over the portion of fin 58 protruding above the STI regions 62, and the HKMG gate structure 68 in the left side in FIG. 1A is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1A, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1A) or the surface of the STI dielectric (as illustrated in the left side of FIG. 1A).

Source and drain regions 54 are semiconductor regions in contact with the semiconductor fin 58. In some embodiments, the source and drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1A. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source and drain regions 54 either in situ during SEG, or by an ion implantation process performed after the SEG, or by a combination thereof.

An interlayer dielectric (ILD) layer 76 (seen in FIG. 1A) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the ILD layer 76. The HKMG gate structures 68, illustrated in FIG. 1A, may then be formed by first removing the dummy gate structures using one or more etching techniques, thereby creating recesses between respective spacers 72.

Next, a replacement gate dielectric layer 66 comprising one more dielectrics, followed by a replacement conductive gate layer 64 comprising one or more conductive materials, are deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like. Excess portions of the gate structure layers 64 and 66 may be removed from over the top surface of the ILD layer 76 using, for example a CMP process. The resulting structure, as illustrated in FIG. 1A, may be a substantially coplanar surface comprising an exposed top surface of the ILD layer 76, spacers 72, and remaining portions of the HKMG gate layers 66 and 64 inlaid between respective spacers 72.

An ILD layer 78 may be deposited over the ILD layer 76, as illustrated in FIG. 1A. In some embodiments, the insulating materials to form the ILD layer 76 and the ILD layer 78 may comprise silicon oxide, phosphosilicate glass (PSG), borosilicate glass (BSG), boron-doped phosphosilicate glass (BPSG), undoped silicate glass (USG), a porous or dense low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the ILD layer 76 and the ILD layer 78 may be deposited using any suitable method, such as CVD, physical vapor deposition (PVD), ALD, PEALD, PECVD, SACVD, FCVD, spin-on, and/or the like, or a combination thereof.

As illustrated in FIG. 1A, electrodes of electronic devices formed in or on the substrate 50 may be electrically connected to conductive features of a first interconnect level 100A using conductive connectors (e.g., contacts 74) formed through the intervening dielectric layers. In the example illustrated in FIG. 1A, the contacts 74 make electrical connections to the source and drain regions 54 of FinFET 60. Contacts 74 to gate electrodes are typically formed over STI regions 62. A separate gate electrode 64 (shown in the left in FIG. 1A) illustrates such contacts. The contacts may be formed using photolithography techniques. For example, a patterned mask may be formed over the ILD layer 78 and used to etch openings that extend through the ILD layer 78 to expose a portion of gate electrodes over STI regions 62, as well as etch openings over the fins 58 that extend further, through the ILD layer 76 and the CESL (not shown) liner below the ILD layer 76 to expose portions of the source and drain regions 54. In some embodiments, an anisotropic dry etch process may be used wherein the etching is performed in two successive steps. The etchants used in the first step of the etch process have a higher etch rate for the materials of the ILD layers 76 and 78 relative to the etch rate for the materials used in the gate electrodes 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL.

In some embodiments, a conductive liner may be formed in the openings in the ILD layer 76 and the ILD layer 78. Subsequently, the openings are filled with a conductive fill material. The liner comprises barrier metals used to reduce out-diffusion of conductive materials from the contacts 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD layer 78. The resulting conductive plugs extend into the ILD layers 76 and 78 and constitute contacts 74 making physical and electrical connections to the electrodes of electronic devices, such as the tri-gate FinFET 60 illustrated in FIG. 1A. In this example, contacts to electrodes over STI regions 62 and to electrodes over fins 58 are formed simultaneously using the same processing steps. However, in other embodiments these two types of contacts may be formed separately.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

As illustrated in FIG. 1A, multiple interconnect levels may be formed, stacked vertically above the contacts 74 formed in the ILD layers 76 and 78, in accordance with a back end of line (BEOL) scheme adopted for the integrated circuit design. In the BEOL scheme illustrated in FIG. 1A, various interconnect levels have similar features. However, it is understood that other embodiments may utilize alternate integration schemes wherein the various interconnect levels may use different features. For example, the contacts 74, which are shown as vertical connectors, may be extended to form conductive lines which transport current laterally.

The interconnect levels (e.g., interconnect levels 100A-100N) comprise conductive vias and lines embedded in an intermetal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the BEOL scheme illustrated in FIG. 1A, conductive vias 104A connect contacts 74 to conductive lines 108A and, at subsequent levels, vias connect lines on a level below the vias to lines above the vias (e.g., a pair of lines 108A and 108B can be connected by via 104B). Other embodiments may adopt a different scheme. For example, vias 104A may be omitted from the 100A level and the contacts 74 may be configured to be directly connected to the conductive lines 108A.

Still referring to FIG. 1A, the first interconnect level 100A may be formed using, for example, a dual damascene process flow. First, a dielectric stack used to form IMD layer 110A may be deposited using one or more layers of the dielectric materials listed in the description of the first and ILD layers 76 and 78. In some embodiments, IMD layer 110A includes an etch stop layer (not shown) positioned at the bottom of the dielectric stack. The etch stop layer comprises one or more insulator layers (e.g., SiO, SiOC, SiCN, SiON, SiN, CN, AlOx, AlN, AlYOx, ZrOx, YOx, combinations thereof, or the like) having an etch rate different than an etch rate of an overlying material. The techniques used to deposit the dielectric stack for IMD may be the same as those used in forming the ILD layers 76 and 78.

Appropriate photolithography and etching techniques (e.g., anisotropic RIE employing fluorocarbon chemicals) may be used to pattern the IMD layer 110A to form openings for vias and lines. The openings for vias may be vertical holes extending through IMD layer 110A to expose a top conductive surface of contacts 74, and openings for lines may be longitudinal trenches formed in an upper portion of the IMD layer. In some embodiments, the method used to pattern holes and trenches in IMD layer 110A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 110A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive vias 104A and lines 10A of the first interconnect level 100A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an ECP deposition step that completely fills the openings with a conductive fill material.

The conductive diffusion barrier liner in the vias 104A and lines 108A may comprise one or more layers of TaN, Ta, TiN, Ti, Co, or the like, or combinations thereof. The conductive fill layer in vias 104A and lines 108A may comprise metals such as W, Cu, Co, Ru, CuMn, Mo, Al, or the like, or combinations thereof, or multi-layers thereof. The conductive materials used in forming the conductive vias 104A and lines 108A may be deposited by any suitable method, for example, CVD, PECVD, PVD, ALD, PEALD, electrochemical plating (ECP), electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD layer 110A outside of the openings may be removed by a planarizing process (e.g., CMP) thereby forming a top surface comprising dielectric regions of IMD layer 110A that are substantially coplanar with conductive regions of lines 108A. The planarization step completes fabrication of the first interconnect level 100A comprising conductive vias 104A and conductive lines 108A embedded in IMD layer 110A, as illustrated in FIG. 1A.

The interconnect level positioned vertically above the first interconnect level 100A in FIG. 1A is the second interconnect level 100B. In some embodiments, the structures of the various interconnect levels (e.g., the first interconnect level 100A and the second interconnect level 100B) may be similar. In the example illustrated in FIG. 1A, the second interconnect level 100B comprises conductive vias 104B and conductive lines 108B embedded in an insulating film IMD 110B having a planar top surface. The materials and processing techniques described above in the context of the first interconnect level 100A may be used to form the second interconnect level 100B and subsequent interconnect levels.

Subsequent interconnect levels may be formed above the first and second interconnect levels 100A and 100B, up to an $N^{th}$ interconnect level 100N. In this example, the $N^{th}$ interconnect level 100N may be formed using the same materials and methods used to form the first and second interconnect levels 100A and 100B. The ellipsis in FIG. 1A indicates one or more additional interconnect levels that may be used to electrically connect between the second interconnect level 100B and the $N^{th}$ interconnect level 100N.

The example electronic device (FinFET 60) is provided for illustrative purposes only to further explain applications of the disclosed embodiments, and is not meant to limit the disclosed embodiments in any manner.

FIG. 1B illustrates a perspective view of region 101 of FIG. 1A, showing a top portion of the $N^{th}$ interconnect level 100N. In FIG. 1B, the $N^{th}$ interconnect level 100N has been illustrated as the interconnect level over which a via 104N+1 (see below, FIGS. 9B-D) is formed as discussed in greater detail below, in accordance with some embodiments. The conductive lines 108N and the IMD 110N are shown for illustrative purposes only; it is understood that the conductive lines 108N and the IMD 110N may be placed at any metallization layer suitable in a particular design, such as e.g. the first metallization layer, the second metallization layer, and/or the fifth metallization layer. Additionally, the structures of the subsequently formed (N+1)th interconnect level 100N+1 (see below, FIGS. 9A-E) may be placed at any metallization layer or layers suitable in a particular design. In some embodiments, the (N+1)th interconnect level 100N+1 is the first interconnect level and may be formed directly on the contacts 74 and the ILD 78 in place of the conductive lines 108N and the IMD 110N, respectively.

FIG. 1B further illustrates reference cross-sections that are used in later figures. Cross-section A-A' is perpendicular to a longitudinal axis of a conductive line 108N, cross-section B-B' is perpendicular to cross-section A-A and is along a longitudinal axis of a conductive line 108N, and cross-section C-C' is parallel to cross-section B-B' and is parallel to and outside of a conductive line 108N.

FIGS. 2A through 12 are cross-sectional and perspective views of intermediate stages in the manufacturing of interconnect structures, in accordance with some embodiments. FIGS. 2A, 2C, 2D, 3A, 4A, 5A, 6A, 6D, 7A, 8A, 9C, 10, 11, and 12 are illustrated along the cross-section A-A' illustrated in FIG. 1B. FIGS. 2B, 3B, 4B, 5B, 6B, 7B, 8B, and 9D are illustrated along the cross-section B-B' illustrated in FIG. 1B. FIGS. 3C, 4C, 5C, 6C, 7C, 8C, and 9E are illustrated along the cross-section C-C' illustrated in FIG. 1B. FIGS. 9A and 9B illustrate perspective views of an intermediate stage in the manufacturing of interconnect structures.

Figure 2A:
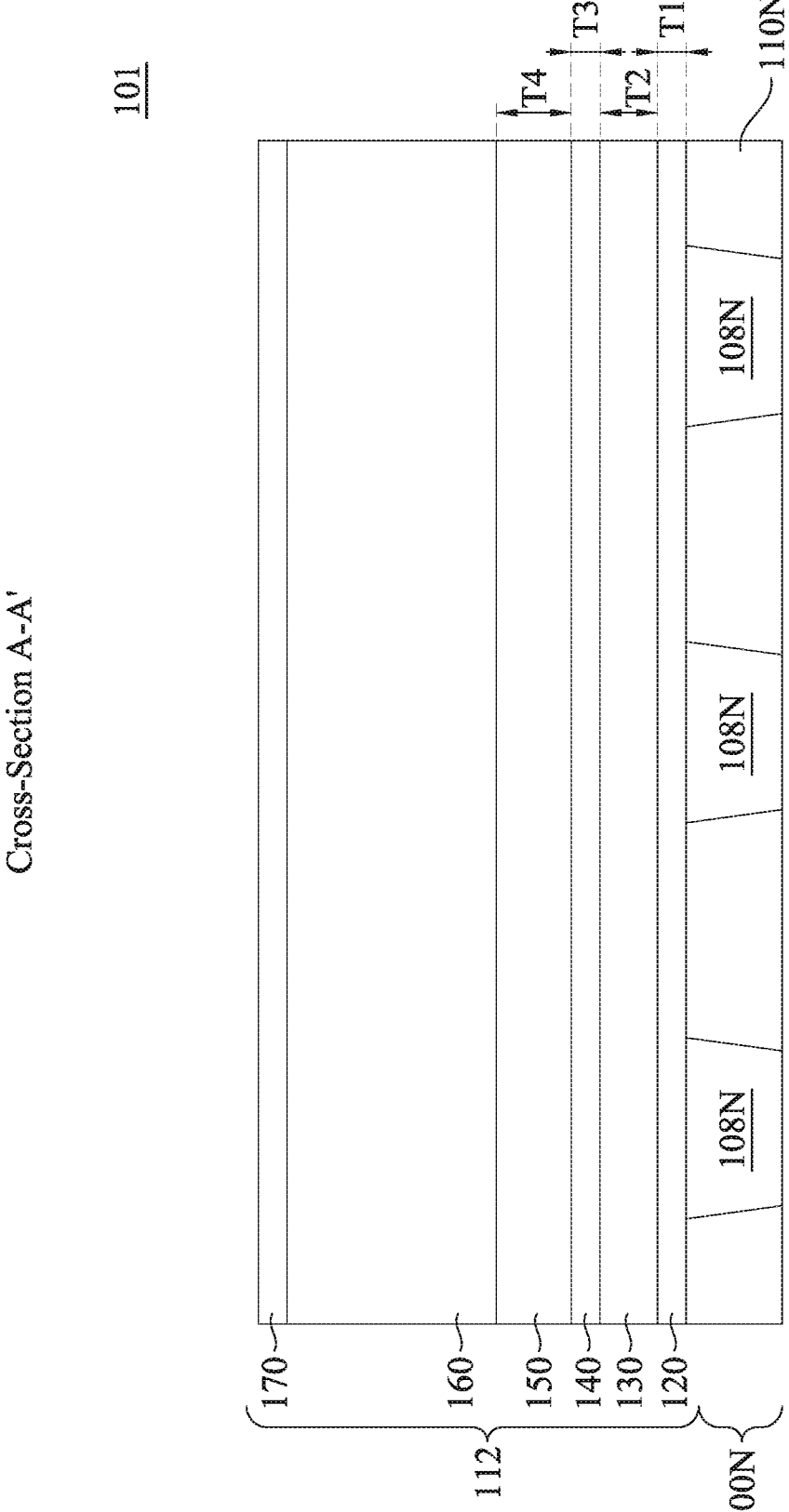
FIG. 2A through 8C illustrate cross-sectional views of interconnect structures at intermediate stages of manufacturing, in accordance with some embodiments.
Figure 2B:
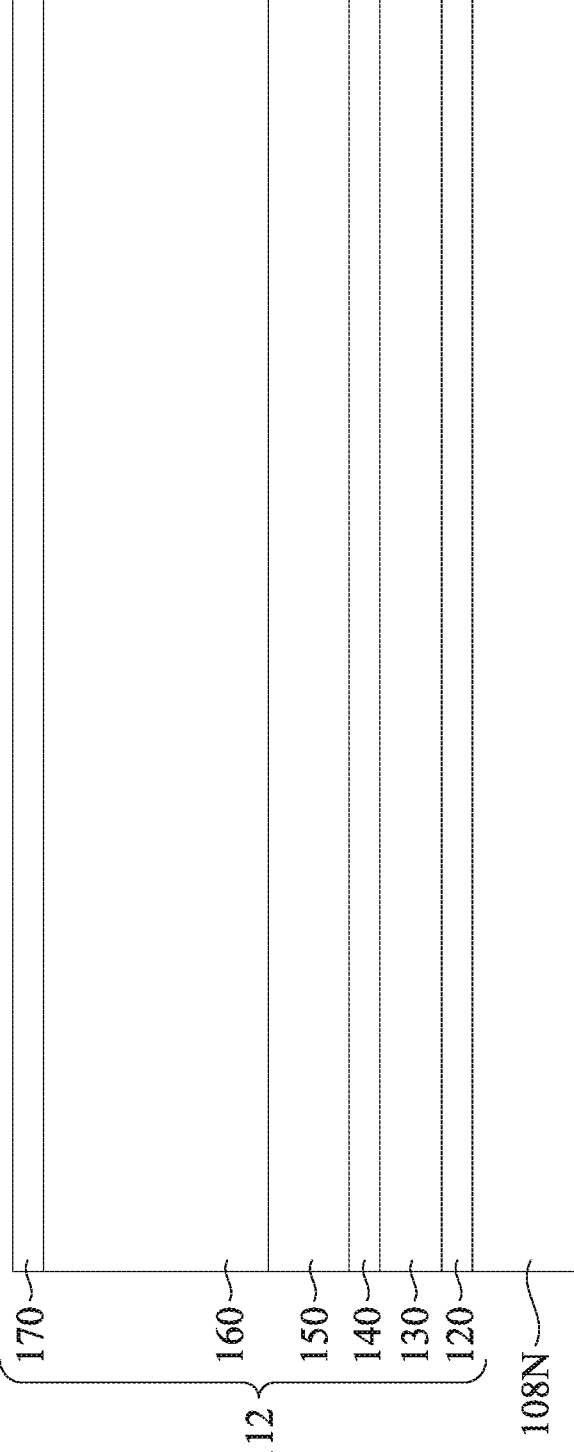

FIGS. 2A and 2B illustrate the formation of a dielectric stack 112 comprising etch stop layers (ESLs) and dielectric layers over the $N^{th}$ interconnect level 100N. The dielectric stack 112 is used for the subsequent formation of conductive vias and conductive lines in an interconnect level formed on the $N^{th}$ interconnect level 100N. In some embodiments in accordance with FIGS. 2A and 2B, dielectric stack 112 comprises an ESL 120 on the $N^{th}$ interconnect level 100N, a dielectric layer 130 on the ESL 120, an ESL 140 on the dielectric layer 130, a dielectric layer 150 on the ESL 140, and another dielectric layer 160 on the dielectric layer 150.

Referring to FIGS. 2A and 2B, the ESL 120 is formed on the $N^{th}$ interconnect level 100N. In some embodiments, the ESL 120 is used for controlling subsequent etching processes to form an opening for a via (see below, FIGS. 5A-6B). The ESL 120 comprises one or more insulator layers such as, e.g., AlOx, AlN, AlYOx, ZrOx, YOx, combinations thereof, or the like, having an etch rate different than an etch rate of the underlying IMD 110N and the subsequently formed overlying material. The ESL 120 may be formed using PECVD, ALD, CVD, or the like.

In some embodiments, the ESL 120 has a thickness T1 in a range of 5 Angstroms to 25 Angstroms. The thickness T1 of the ESL 120 being less than 5 Angstroms may be disadvantageous as it may not be thick enough to control subsequent etches. The thickness T1 of the ESL 120 being greater than 25 Angstroms may be disadvantageous as it may be too thick to be removed without over-etching adjacent dielectric layers.

Next, the dielectric layer 130 is formed on the ESL 120. The dielectric layer 130 can be used for controlling subsequent etching processes to form an opening for a via (see below, FIGS. 5A and 5B) and/or for providing structural and electrical isolation of conductive structures within or near the layer. The dielectric layer 130 comprises one or more insulator layers such as, e.g., e.g., SiO, SiOC, SiCN, SiON, SiN, or the like. In accordance with some embodiments, the dielectric layer 130 is formed using PECVD, FCVD, spin-on coating, or the like.

In some embodiments, the dielectric layer 130 has a thickness T2 in a range of 20 Angstroms to 100 Angstroms. The thickness T2 of the dielectric layer 130 being less than 20 Angstroms may be disadvantageous as it may lead to the via having an undesirably small volume which may increase via resistance and decrease device performance. The thickness T2 of the dielectric layer 130 being greater than 100 Angstroms may be disadvantageous as it may lead to the via having an undesirably large height which may increase via resistance, decrease device performance, and/or increase the overall device size.

An ESL 140 is subsequently formed on the dielectric layer 130. In some embodiments, the ESL 140 is used for controlling subsequent etching processes to form an opening for a via (see below, FIGS. 3A-6B). The ESL 140 may be formed using similar methods and materials as described above for the ESL 120. The ESL 140 may have an etch rate different than an etch rate of the underlying dielectric layer 130 and the subsequently formed overlying material.

In some embodiments, the ESL 140 has a thickness T3 in a range of 5 Angstroms to 30 Angstroms. The thickness T3 of the ESL 140 being less than 5 Angstroms may be disadvantageous as it may not be thick enough to control subsequent etches. The thickness T3 of the ESL 140 being greater than 30 Angstroms may be disadvantageous as it may be too thick to be removed without over-etching adjacent dielectric layers.

Still referring to FIGS. 2A and 2B, a dielectric layer 150 may be formed on the ESL 140. The dielectric layer 150 can be used for controlling subsequent etching processes to form an opening for a via (see below, FIGS. 3A through 5B) and/or for providing structural and electrical isolation of conductive structures within or near the layer. The dielectric layer 150 may be formed using similar methods and materials as described above for the dielectric layer 130.

In some embodiments, the dielectric layer 150 has a thickness T4 in a range of 20 Angstroms to 100 Angstroms. The thickness T4 of the dielectric layer 150 being less than 20 Angstroms may be disadvantageous as it may lead to the via having an undesirably small volume which may increase via resistance and decrease device performance. The thickness T4 of the dielectric layer 150 being greater than 100 Angstroms may be disadvantageous as it may lead to the via having an undesirably large height which may increase via resistance and decrease device performance.

Next, a dielectric layer 160 is formed on the dielectric layer 150. The dielectric layer 160 may be used to form the bulk of an inter metal dielectric (IMD) surrounding conductive vias and conductive lines of a subsequently formed interconnect level on the $N^{th}$ interconnect level 100N (see below, FIGS. 9A-C). In some embodiments, the insulating materials to form the dielectric layer 160 may comprise a porous or dense low dielectric constant (low-k) dielectric such as, e.g., silicon oxycarbide (SiOCH), fluorosilicate glass (FSG), carbon-doped oxide (CDO), flowable oxide, or porous oxides (e.g., xerogels/aerogels), silicon oxide, phosphosilicate glass (PSG), borosilicate glass (BSG), boron-doped phosphosilicate glass (BPSG), undoped silicate glass (USG), or the like, or a combination thereof. The dielectric materials used to form the ILD layer 76 and the ILD layer 78 may be deposited using any suitable method, such as CVD, physical vapor deposition (PVD), ALD, PEALD, PECVD, SACVD, FCVD, spin-on, and/or the like, or a combination thereof.

Further referring to FIGS. 2A and 2B, a mask layer 170 may be formed on the dielectric layer 160. The mask layer 170 can be used for controlling subsequent etching processes to form an opening for a via (see below, FIGS. 3A through 6B). The mask layer 170 may comprise, e.g., silicon nitride, silicon carbide, or the like. The mask layer 170 may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Figure 2C:
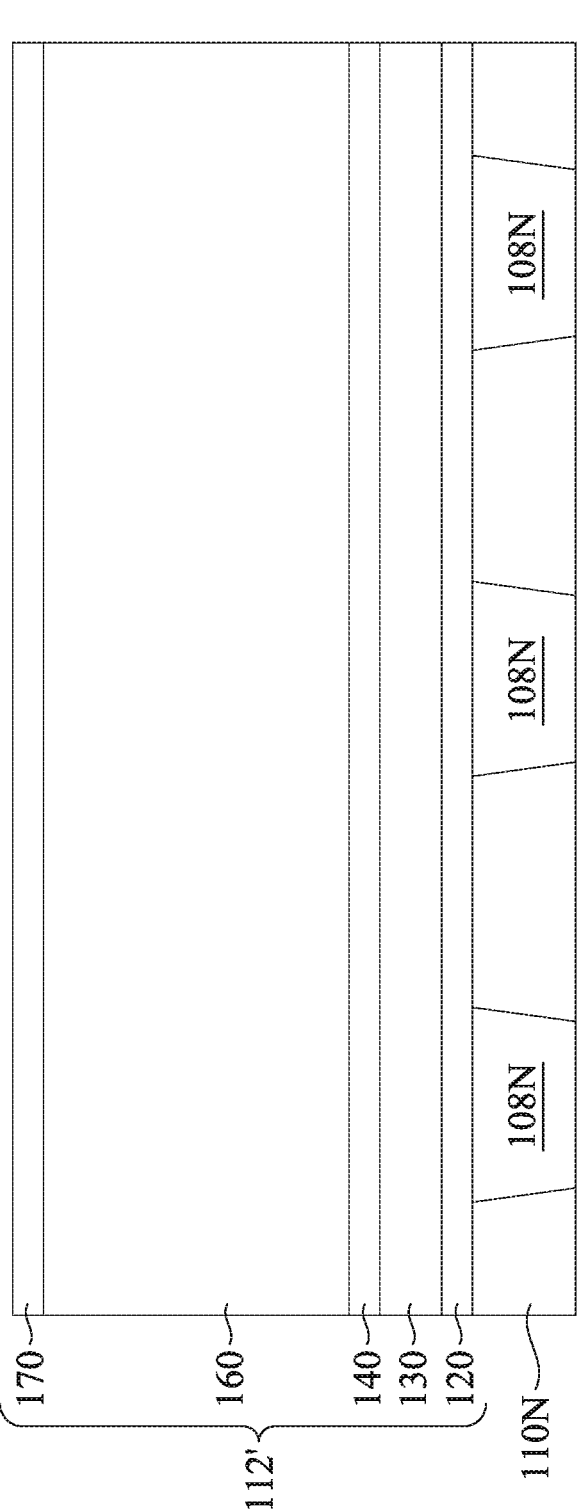
Figure 2D:
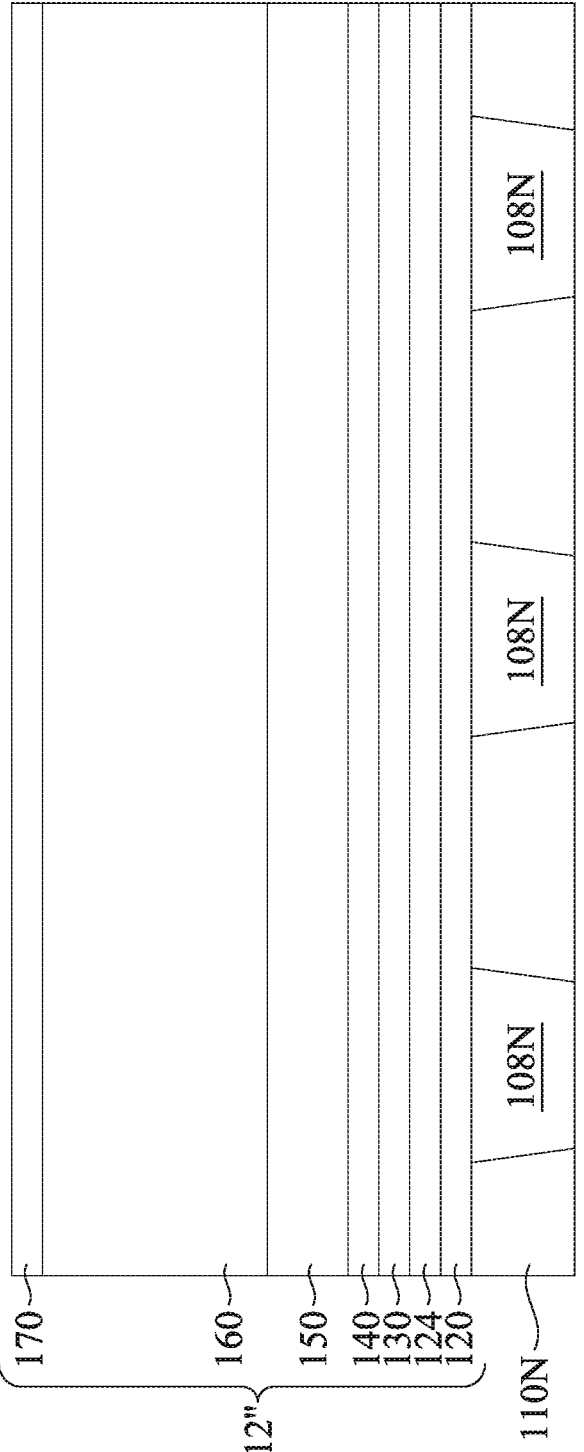

FIGS. 2C and 2D illustrate dielectric stacks 112' and 112", in accordance with some embodiments. The dielectric stack 112' may be formed using similar methods and materials as the dielectric stack 112 described in respect to FIGS. 2A and 2B but with the dielectric layer 160 formed directly on the ESL 140.

The dielectric stack 112" may be formed using similar methods and materials as the dielectric stack 112 described in respect to FIGS. 2A and 2B but with an additional dielectric layer 124 formed between the ESL 120 and the dielectric layer 130. The dielectric layer 124 can be used for controlling subsequent etching processes to form an opening for a via (see below, FIGS. 3A through 5B) and/or for providing structural and electrical isolation of conductive structures within or near the layer. The dielectric layer 124 may be formed using similar methods and materials as described above for the dielectric layer 130. In some embodiments, the dielectric layer 124 comprises materials having a different etch rate from the etch rate of the materials of the dielectric layer 130.

Figure 3A:
Figure 3A:
Figure 3A:
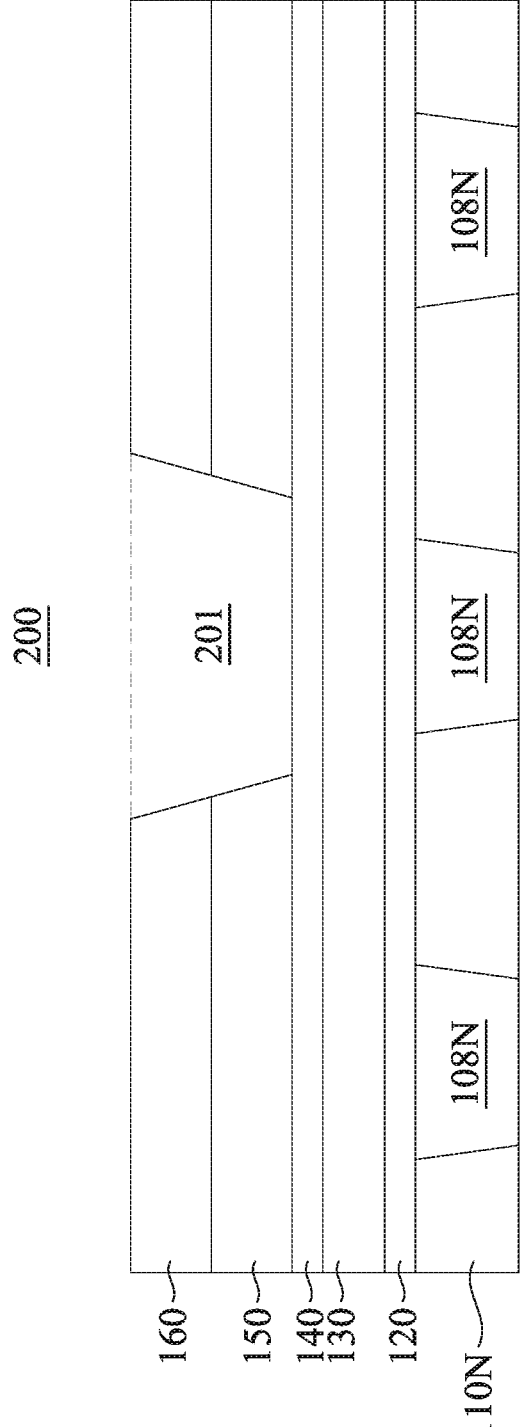
Figure 3B:
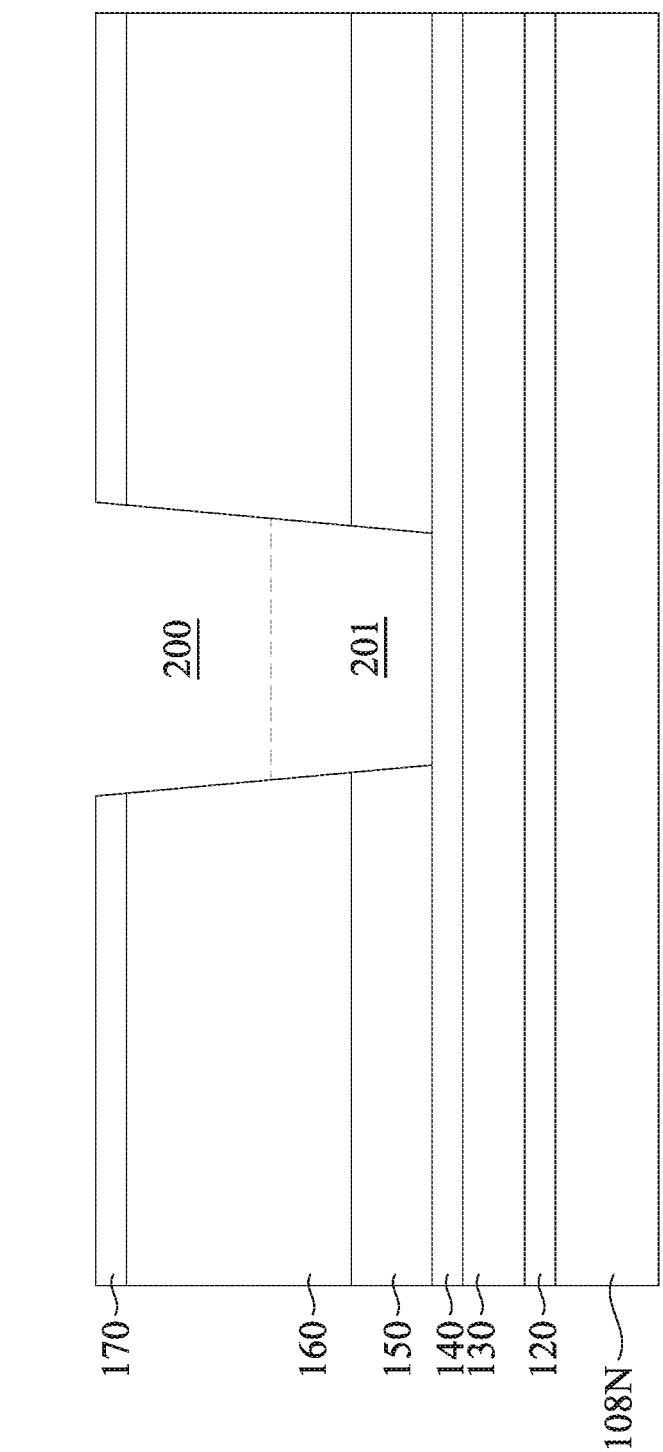
Figure 3C:
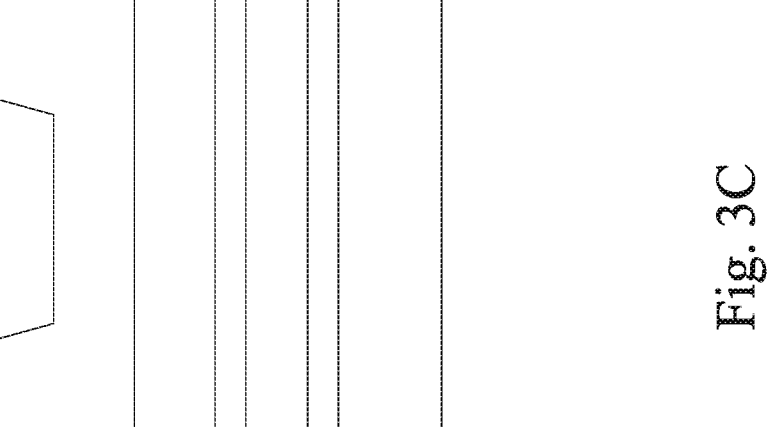

In FIGS. 3A, 3B, and 3C, following from FIGS. 2A and 2B, an opening 200 for a subsequently formed conductive line (see below, FIGS. 9A-C) and an opening 201 for a subsequently formed conductive via (see below, FIGS. 9A-C) are formed through the mask layer 170, the dielectric layer 160, and the dielectric layer 150. FIG. 3A illustrates the cross-section A-A' (see FIG. 1B above) through the opening 200, FIG. 3B illustrates the cross-section B-B' (see FIG. 1B above) perpendicular to the cross-section A-A' through the openings 200 and 201, and FIG. 3C illustrates the cross-section C-C' (see FIG. 1B above) parallel to the cross-section B-B' through a portion of the opening 200 not intersecting with the opening 201. Appropriate photolithography and etching techniques may be used to pattern the hard mask layer 170 and transfer that pattern to the dielectric layer 16, and the dielectric layer 150. The opening 201 for the conductive via may be a vertical hole extending through the dielectric layer 160, and the dielectric layer 150 to expose a top surface of the ESL 140, and the opening 200 for the conductive line may be a longitudinal trench formed in an upper portion of the dielectric layer 160.

In some embodiments, the method used to pattern openings 200 and 201 through the hard mask layer 170, the dielectric layer 160, and the dielectric layer 150 utilizes a via-first scheme, wherein a first photolithography and etch process form openings 201 for vias, and a second photolithography and etch process form openings 200 for lines. Other embodiments may use a different method, for example, a trench-first scheme, or an incomplete via-first scheme, or a buried etch stop layer scheme. The parameters of the various etch steps (e.g., chemical composition, flow rate, and pressure of the gases, reactor power, etc.) may be tuned to produce tapered sidewall profiles with a desired interior taper angle. In some embodiments, the etch process is a dry etch such as e.g. an RIE using Ar, $C_4F_8$, $CF_4$, $C_4F_6$, $CH_2F_2$, $CH_4$, $N_2$, $O_2$, CO, $CO_2$, $H_2$, the like, or a combination thereof as an etch gas. The etch may be performed at a temperature in a range of 60° C. to 200° C., for a duration in a range of 5 s to 1200 s. However, any suitable process may be used to form the openings 200 and 201.

Figure 4A:
Figure 4A:
Figure 4A:
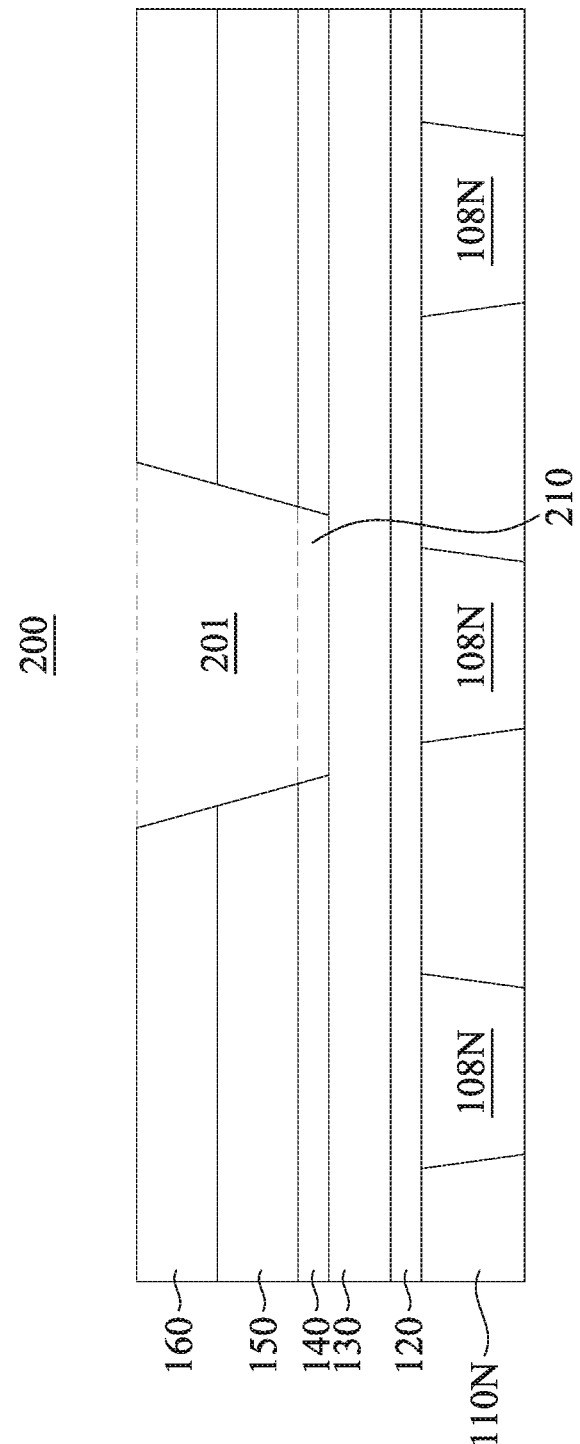
Figure 4B:
Figure 4B:
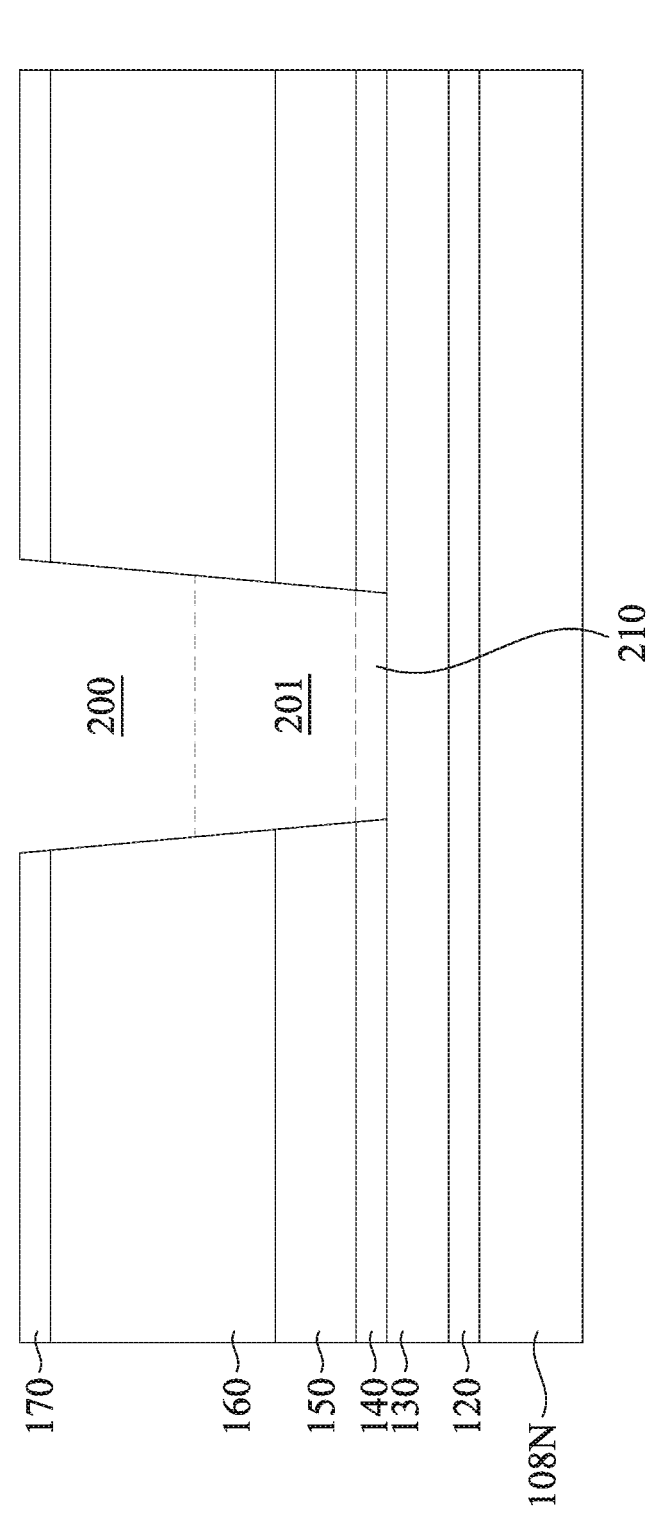
Figure 4C:
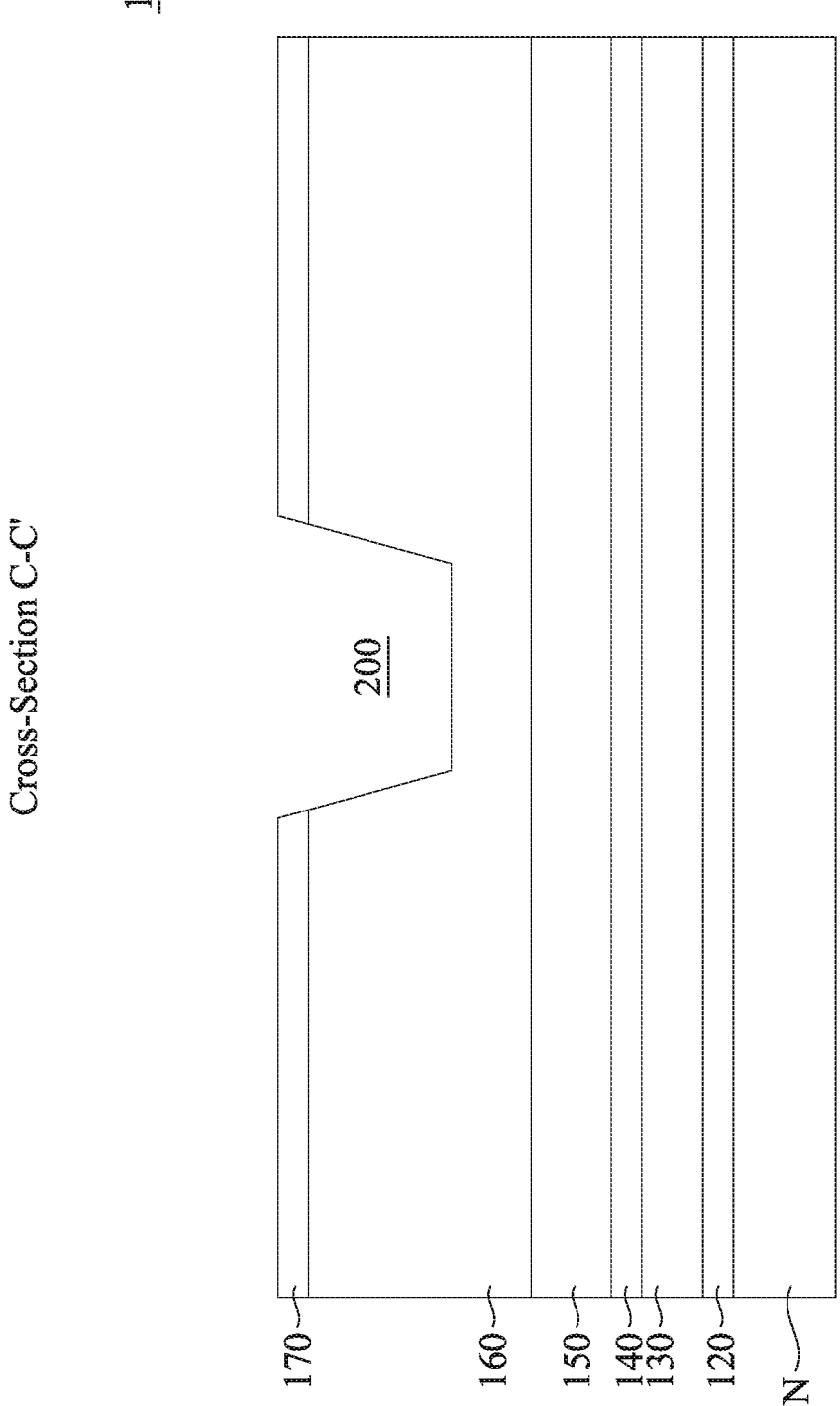

In FIGS. 4A, 4B, and 4C, a portion of the ESL 140 is removed to form an additional opening 210 below the opening 201 that exposes a top surface of the dielectric layer 130. Removing the portion of the ESL 140 may be advantageous for a subsequent widening of the opening 201 for a subsequently formed conductive via (see below, FIGS. 5A-6C). The portion of the ESL 140 may be removed with a wet cleaning process. The wet cleaning process may have a higher etch selectivity with the material of the ESL 140 than an etch selectivity with the material of the dielectric layers 130, 150, and 160 so that the portion of the ESL 140 is removed without significant etching of the dielectric layers 130, 150, and 160. In some embodiments, the wet clean comprises a solvent such as, e.g., $H_2SO_4$, HCl, $H_2O_2$, or the like, or an aqueous solution with a pH greater than 7.0 comprising, e.g., NaOH, KOH, $NH_4OH$, or the like, or a combination thereof. The wet clean may be performed at a temperature in a range of 30° C. to 100° C., for a duration in a range of 5 s to 1200 s. However, any suitable process may be used to form the opening 210.

Figure 5A:
Figure 5A:
Figure 5A:
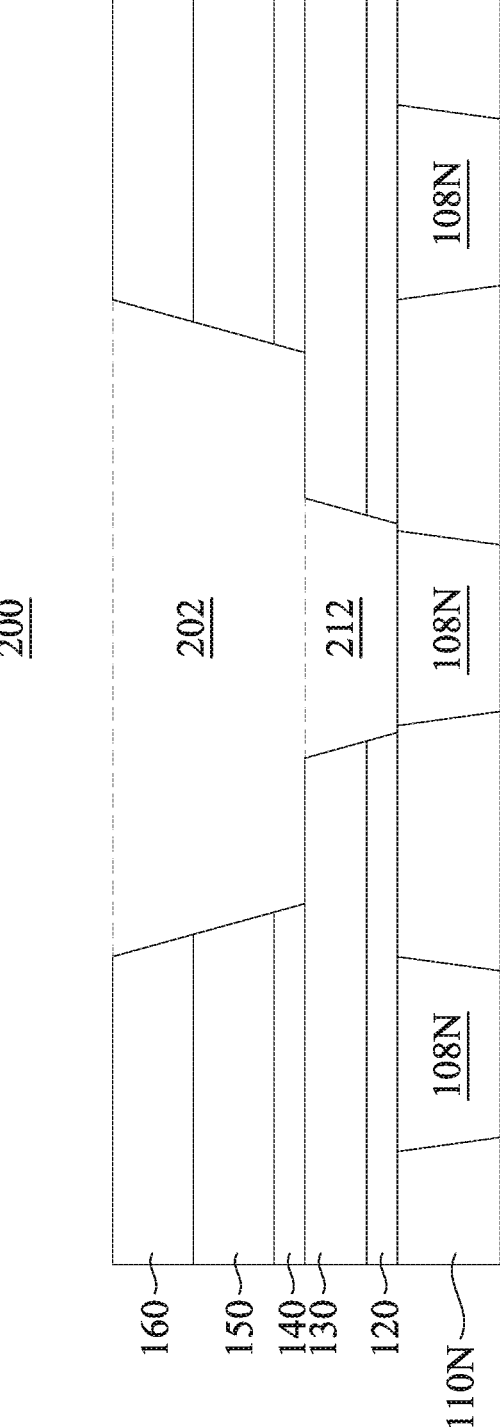
Figure 5B:
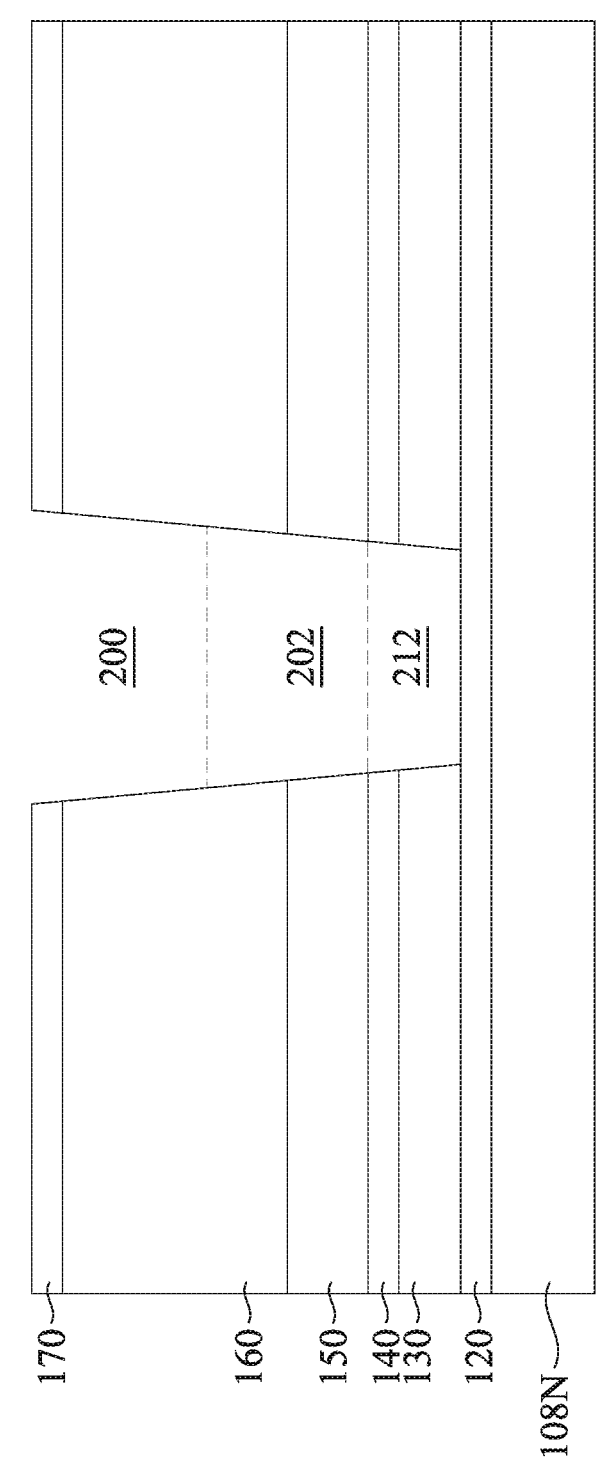
Figure 5C:
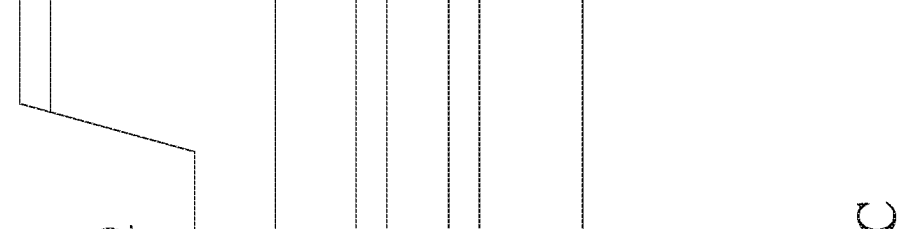

In FIGS. 5A, 5B, and 5C, an opening 202 is formed by widening the opening 201 into sidewalls of the dielectric layers 150 and 160, and an opening 212 is formed by extending the opening 210 through the dielectric layer 130 to expose a top surface of the ESL 120. Forming the openings 202 and 212 may be advantageous for increasing the volume of a subsequently formed conductive via (see below, FIGS. 9A-C), which may reduce via resistance and increase device performance.

The openings 202 and 212 may be formed with a linear removal method (LRM) such as an atomic layer etch (ALE) that etches the sidewalls of the dielectric layers 150 and 160 than the top surface of the dielectric layer 160. The ALE may be a cyclic etch comprising 2 cycles to 25 cycles. Each cycle of the ALE comprises a selective deposition of a dielectric material, such as a polymer, on the top surface of the dielectric layer 160, followed by an etching process, such as an isotropic etch. Each cycle of the ALE may remove more material from the sidewalls of the dielectric layers 150 and 160 than the top surface of the dielectric layer 160 because the polymer deposited on the top surface of the dielectric layer 160 can alleviate the etching rate of the top surface of the dielectric layer 160. Due to this, the lateral etching rate of the sidewalls of the dielectric layers 150 and 160 is greater than the etching rate of the top surface of the dielectric layer 160.

In some embodiments, the LRM is a dry etch such as e.g. an RIE using Ar, $C_4F_8$, $CF_4$, $C_4F_6$, $CH_2F_2$, $CH_4$, $N_2$, $O_2$, CO, $CO_2$, $H_2$, the like, or a combination thereof as an etch gas. The etch may be performed at a temperature in a range of 60° C. to 200° C. Each cycle of the etch may be performed for a duration in a range of 5 s to 1200 s. However, any suitable process may be used to form the openings 202 and 212.

Forming the opening 202 with an increased width may be advantageous for providing larger via faceting which may improve subsequent metal filling of the conductive vias (see below, FIGS. 8A-C). The increased width of the opening 202 may achieve a two step structure for the subsequently formed conductive vias, which may be advantageous for increasing the via volumes to reduce via resistance while keeping the contact areas small to reduce bridging between adjacent conductive vias. In some embodiments, the opening 202 may extend over multiple adjacent conductive lines 108N (see below, FIG. 6D).

Figure 6A:
Figure 6B:
Figure 6B:
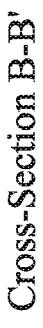
Figure 6B:
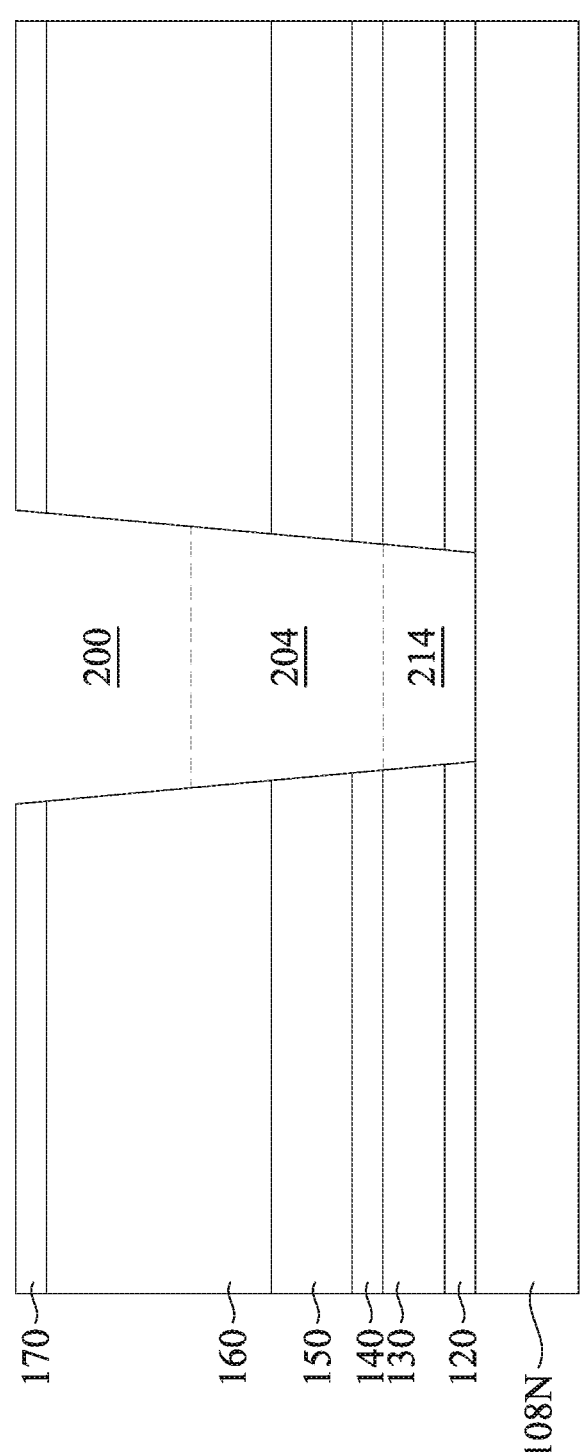
Figure 6C:
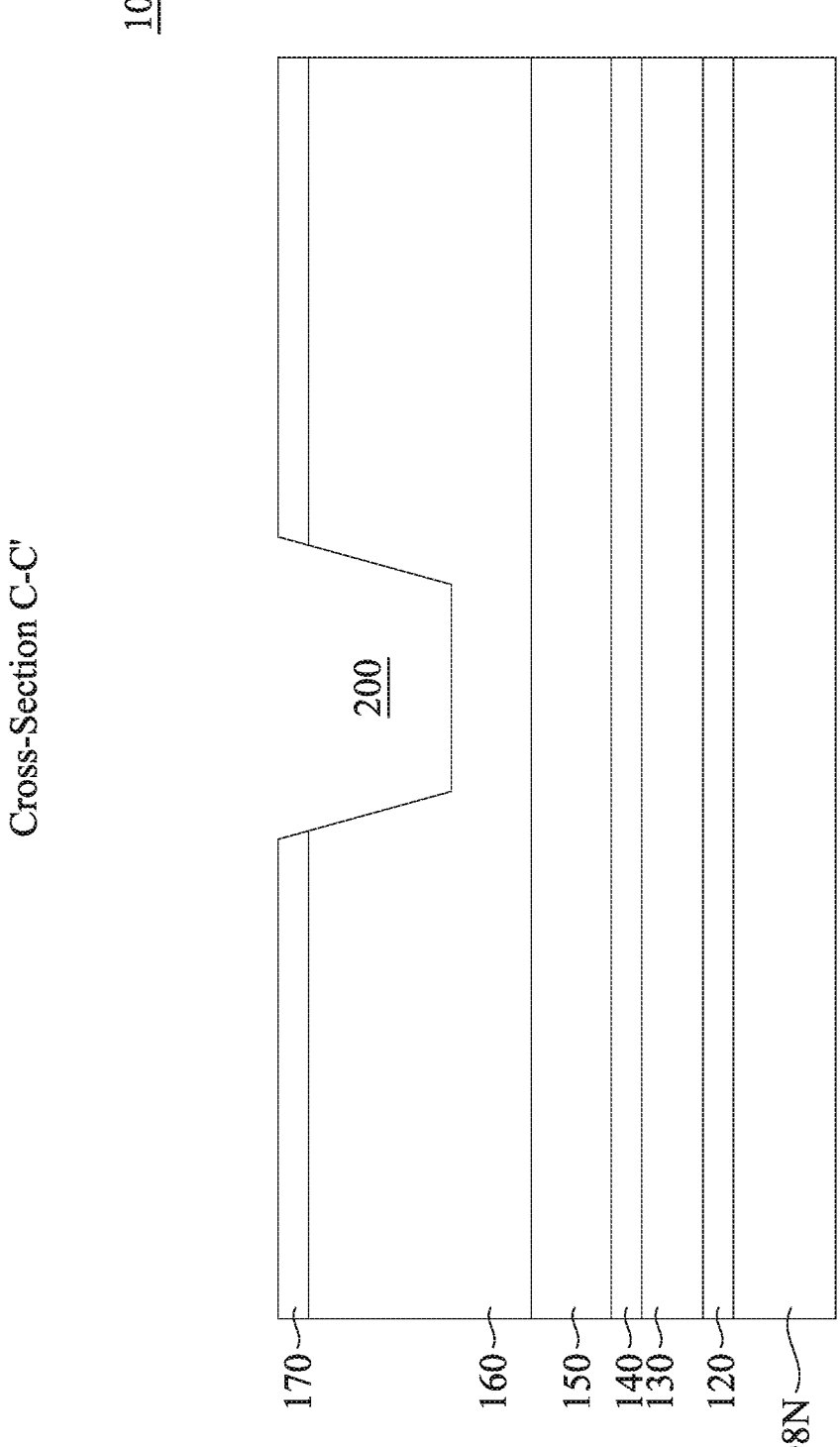

In FIGS. 6A, 6B, and 6C, a portion of the ESL 140 is removed to expand the opening 202 into an opening 204 that exposes a top surface of the dielectric layer 130, and a portion of the ESL 120 is removed to expand the opening 212 into an opening 214 that exposes a top surface of the conductive line 108N. The respective portions of the ESLs 120 and 140 may be removed with a wet cleaning process. The wet cleaning process may have a higher etch selectivity with the material of the ESL 120 and ESL 140 than an etch selectivity with the material of the dielectric layers 130, 150, and 160 so that the portions of the ESLs 120 and 140 are removed without significant etching of the dielectric layers 130, 150, and 160. In some embodiments, the wet clean is performed using similar processes and chemicals as the wet clean described above in respect to FIGS. 4A-C. However, any suitable process may be used to form the openings 204 and 214.

The opening 214 may have a bottom width W1 in a range of 8 nm to 20 nm, which may be advantageous for increasing the volume of a subsequently formed via (see below, FIGS. 9A-C), which may decrease via resistance and improve device performance. The bottom width W1 being less than 8 nm may be disadvantageous because it may lead to a profile of the via being too narrow in a top view, which may adversely affect metal filling of the via and lead to a worse connection between layers. The bottom width W1 being greater than 20 nm may be disadvantageous because it may lead to a profile of the via being too wide in a top view, which may lead to bridging with adjacent conductive vias or lines.

The opening 214 may have a top width W2 in a range of 10 nm to 25 nm, which may be advantageous for increasing the volume of a subsequently formed via (see below, FIGS. 9A-C), which may decrease via resistance and improve device performance. The top width W2 being less than 10 nm may be disadvantageous because it may lead to a profile of the via being too narrow in a top view, which may adversely affect metal filling of the via and lead to a worse connection between layers. The top width W2 being greater than 25 nm may be disadvantageous because it may lead to a profile of the via being too wide in a top view, which may lead to bridging with adjacent conductive vias or lines.

The opening 204 may have a bottom width W3 in a range of 14 nm to 40 nm, which may be advantageous for increasing the volume of a subsequently formed via (see below, FIGS. 9A-C), which may decrease via resistance and improve device performance. The bottom width W3 being less than 14 nm may be disadvantageous because it may lead to a profile of the via being too narrow in a top view, which may adversely affect metal filling of the via and lead to a worse connection between layers. The bottom width W3 being greater than 40 nm may be disadvantageous because it may lead to a profile of the via being too wide in a top view, which may lead to bridging with adjacent conductive vias or lines.

The opening 204 may have a top width W4 in a range of 25 nm to 80 nm, which may be advantageous for increasing the volume of a subsequently formed via (see below, FIGS. 9A-C), which may decrease via resistance and improve device performance. The top width W4 being less than 25 nm may be disadvantageous because it may adversely affect metal filling of the via and lead to a worse connection between layers. The top width W4 being greater than 80 nm may be disadvantageous because it may lead to a profile of the via being too wide in a top view, which may lead to bridging with adjacent conductive vias or lines.

The bottom width W3 may be greater than or equal to about 1.2 times the bottom width W1 when the bottom width W1 is less than about 20 nm. The top width W4 may be greater than or equal to about 1.8 times the bottom width W3. The bottom width W3 may be greater than or equal to about 1.4 times the top width W2. The top width W2 may be greater than or equal to about 1.25 times the bottom width W1.

In some embodiments, a portion of the dielectric layer 160 in the cross-section A-A' adjacent to the opening 204 has a thickness T5 in a range of 250 Angstroms to 500 Angstroms after the opening 204 is formed, which may be advantageous for controlling the height of the subsequently formed via to achieve a larger volume (see below, FIGS. 9A-C). The thickness T5 of the dielectric layer 160 being less than 250 Angstroms may be disadvantageous as it may lead to the via having an undesirably small volume which may increase via resistance and decrease device performance. The thickness T5 of the dielectric layer 160 being greater than 500 Angstroms may be disadvantageous as it may lead to the via having an undesirably large height which may increase via resistance and decrease device performance.

Figure 6D:
Figure 6D:
Figure 6D:
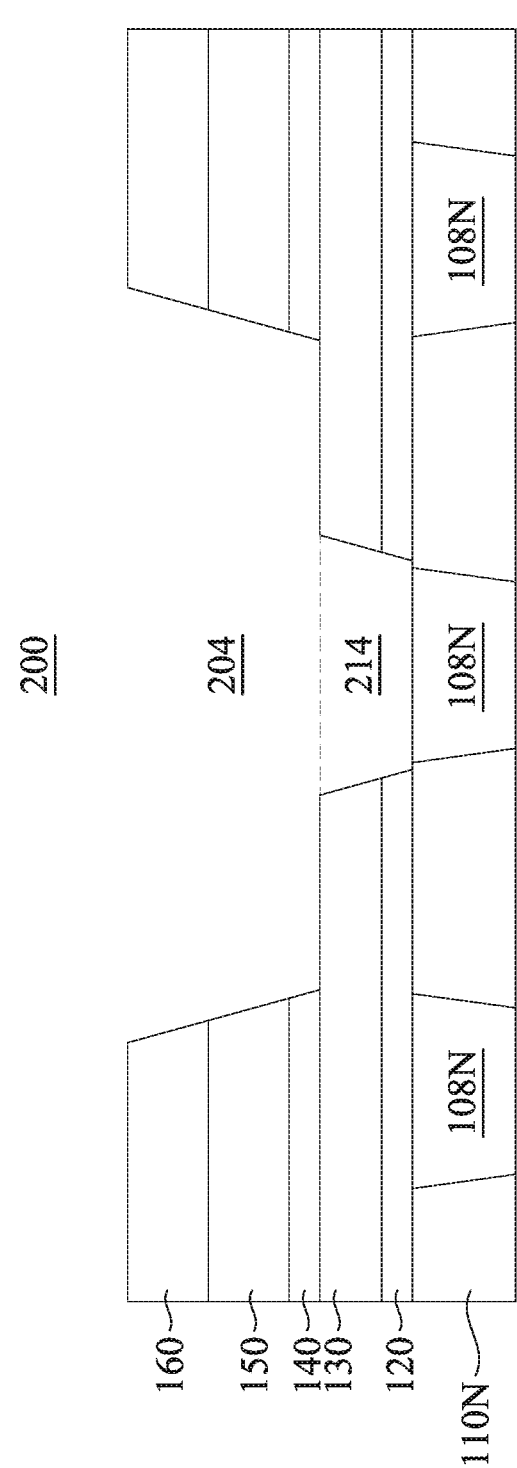

FIG. 6D illustrates the opening 204 extending over one or more conductive lines 108N adjacent to the conductive line 108N exposed by the opening 214, in accordance with some embodiments. The opening 204 extending over multiple conductive lines 108N may be advantageous for increasing the volume of the subsequently formed via and thereby decreasing via resistance and improving the metal filling of the opening 214.

Figure 7A:
Figure 7A:
Figure 7A:
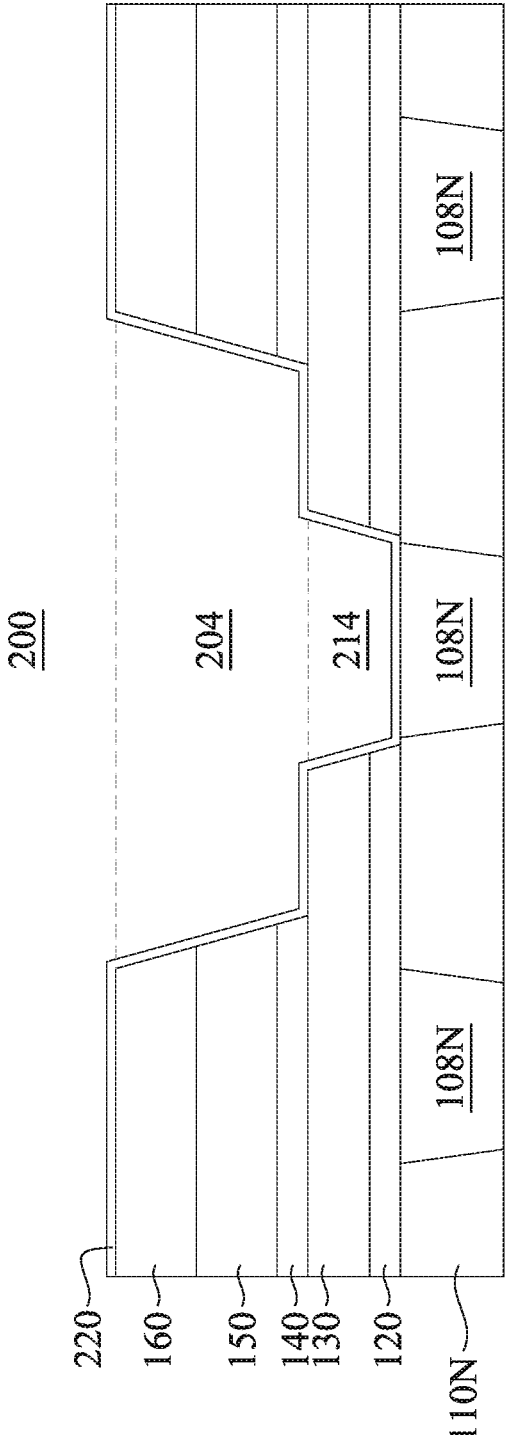
Figure 7B:
Figure 7B:
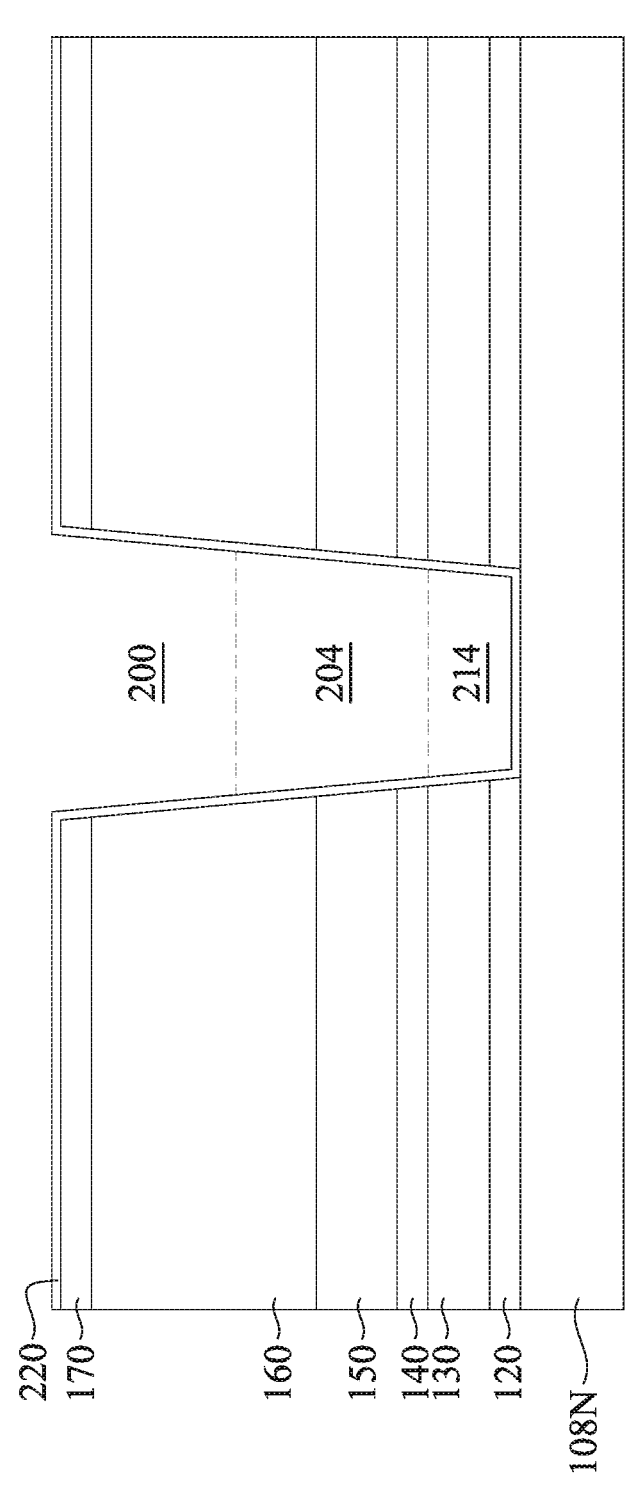
Figure 7C:
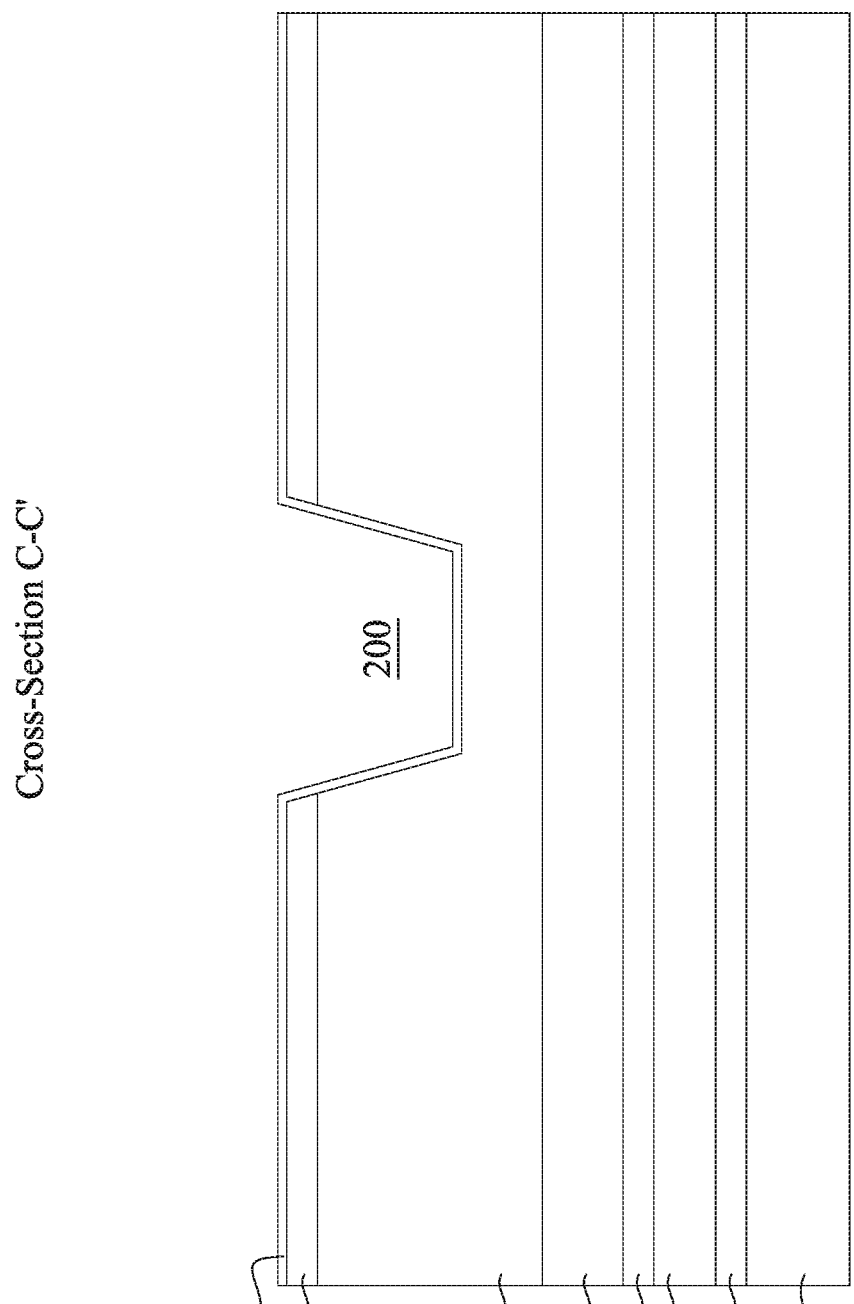

In FIGS. 7A, 7B, and 7C, a conductive diffusion barrier liner 220 is formed over the structure, lining the sidewalls and bottom surfaces of the openings 200, 204, and 214. The conductive diffusion barrier liner 220 may reduce out-diffusion of conductive materials subsequently formed in the openings 200, 204, and 214 (see below, FIGS. 8A-8C) into the surrounding dielectric materials. The conductive diffusion barrier liner 220 may comprise one or more layers of TaN, Ta, TiN, Ti, Co, or the like, or combinations thereof. The conductive diffusion barrier liner 220 may be deposited by any suitable method, for example, CVD, PECVD, PVD, ALD, PEALD, electrochemical plating (ECP), electroless plating and the like.

Figure 8A:
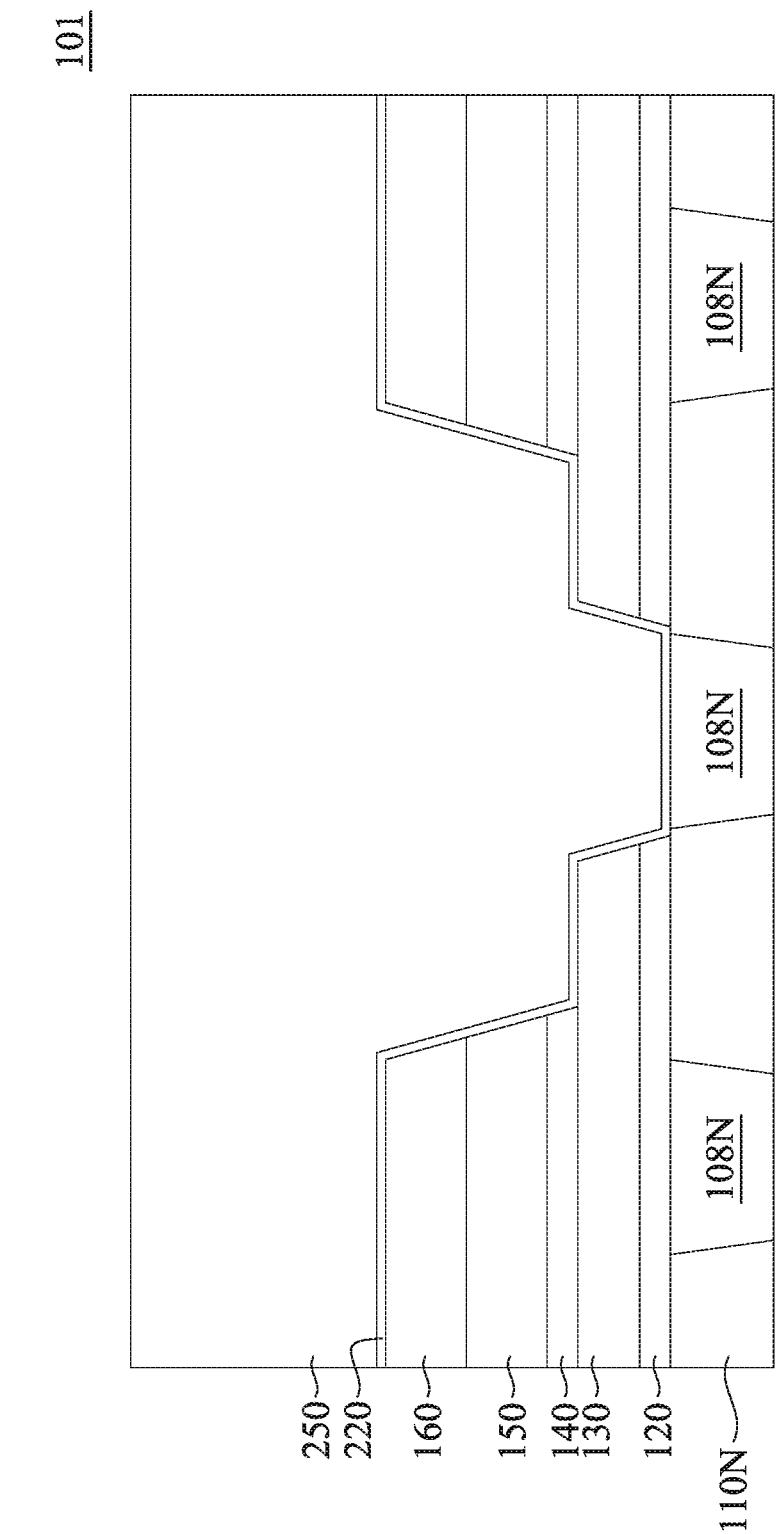
Figure 8B:
Figure 8C:
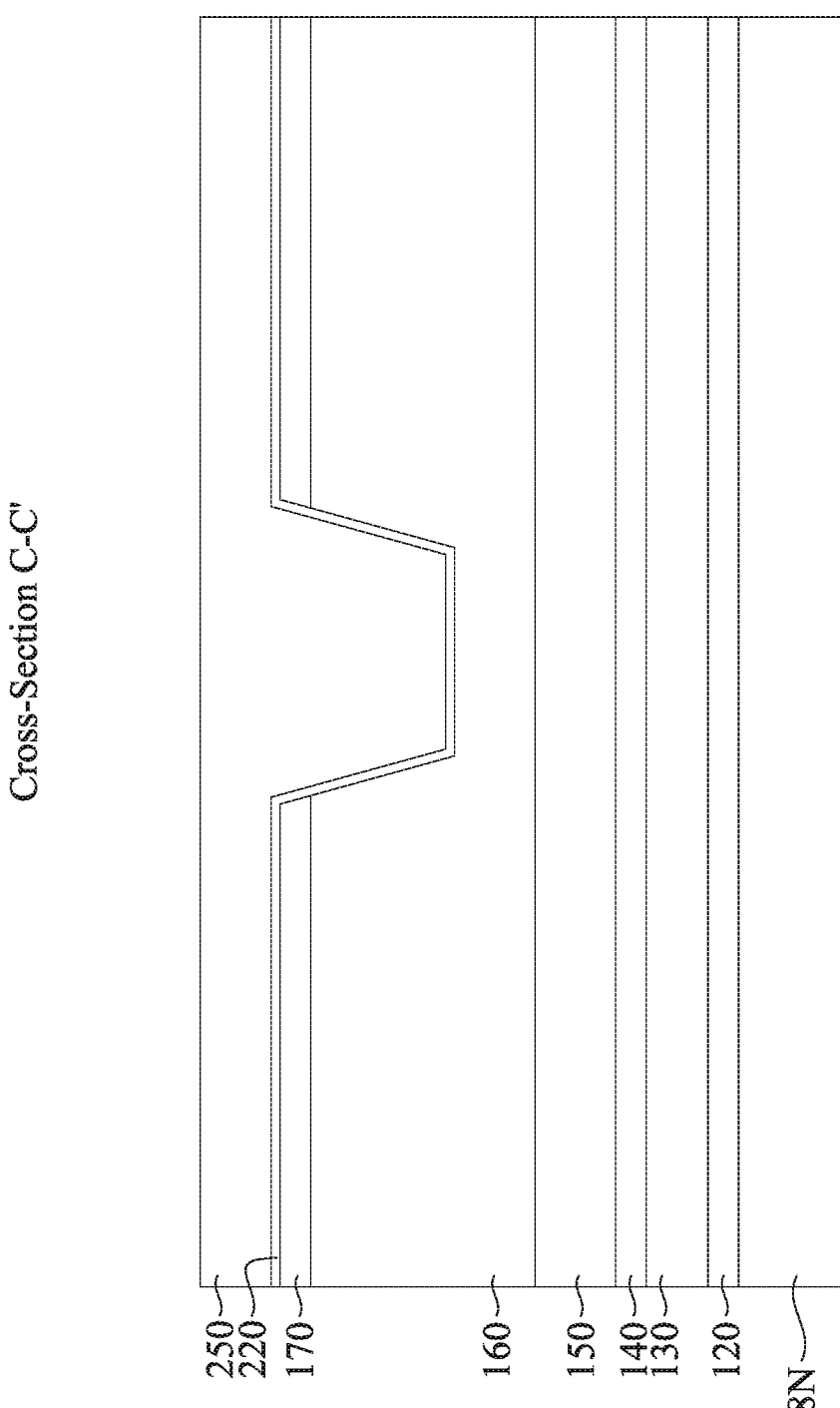

In FIGS. 8A, 8B, and 8C, a conductive fill material 250 is formed over the conductive diffusion barrier liner 220 to completely fill the openings 200, 204, and 214. In some embodiments, a thin conductive seed layer may be deposited over the conductive diffusion barrier liner 220 to help initiate an ECP deposition step in which the conductive fill material 250 completely fills the openings. The conductive fill material 250 may comprise metals such as W, Cu, Co, Ru, CuMn, Mo, Al, or the like, or combinations thereof, or multi-layers thereof. The conductive fill material 250 may be deposited by any suitable method, for example, CVD, PECVD, PVD, ALD, PEALD, electrochemical plating (ECP), electroless plating and the like. In some embodiments, the conductive seed layer may be of the same conductive material as the conductive fill material 250 and deposited using a suitable deposition technique (e.g., CVD, PECVD, ALD, PEALD, or PVD, or the like).

The increased widths of the openings 204 and 214 may be advantageous for improving the filling process with the conductive fill material 250. This may be advantageous by providing better connection between interconnect layers.

Figure 9A:
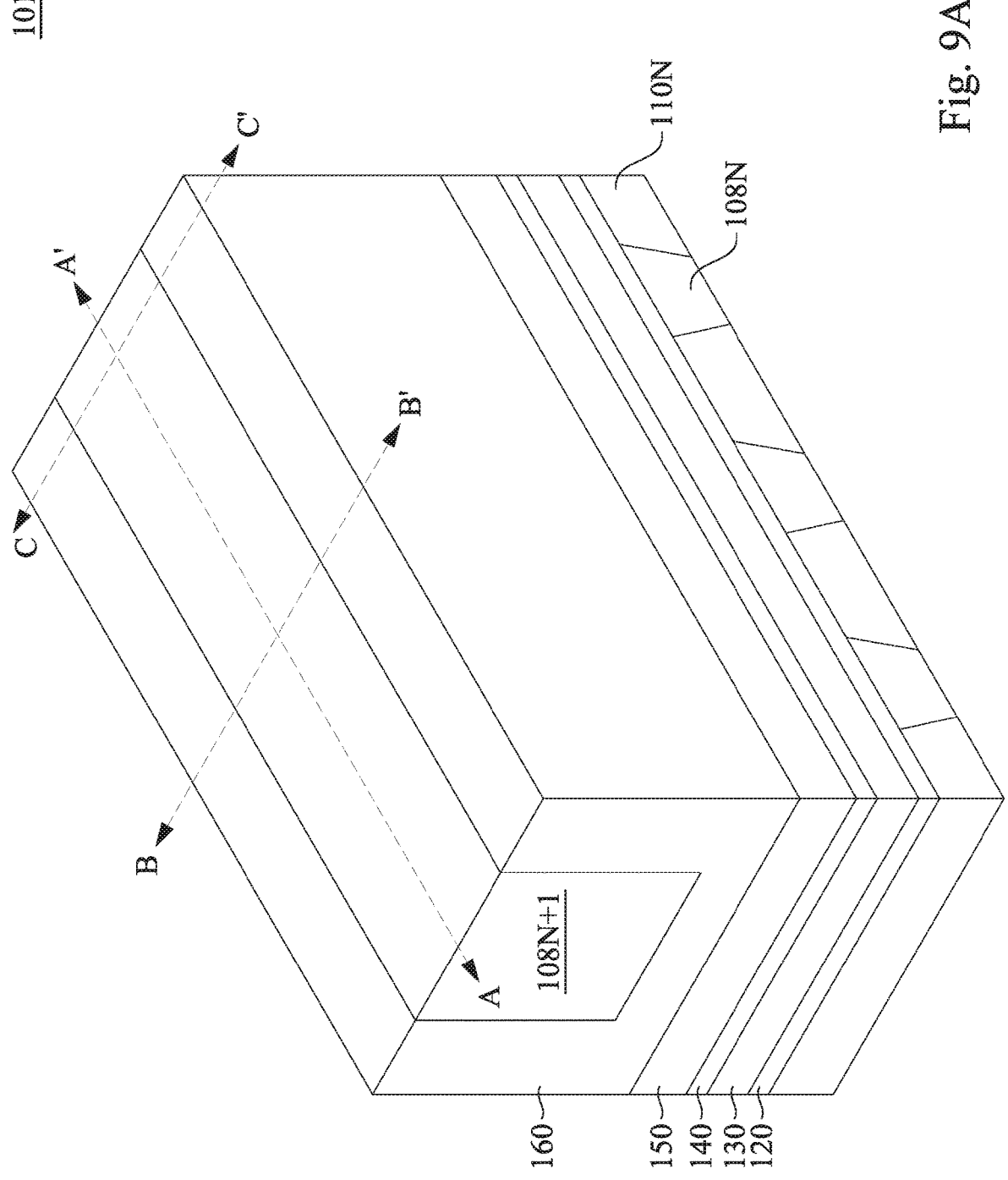
FIGS. 9A and 9B illustrate perspective views of an interconnect structure at an intermediate stage of manufacturing, in accordance with some embodiments.
Figure 9B:
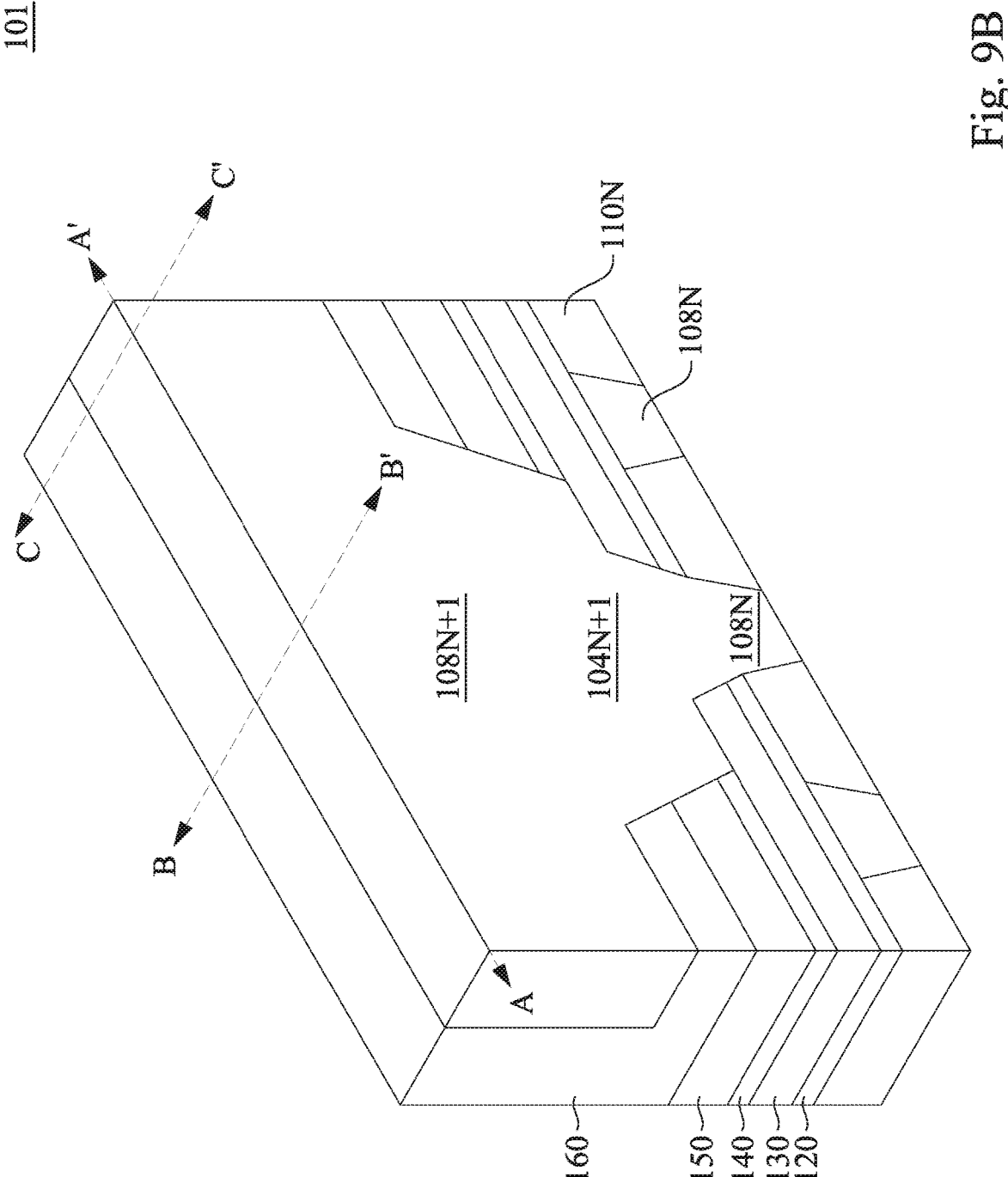
Figure 9C:
FIGS. 9C through 9E illustrate cross-sectional views of interconnect structures at intermediate stages of manufacturing, in accordance with some embodiments.
Figure 9C:
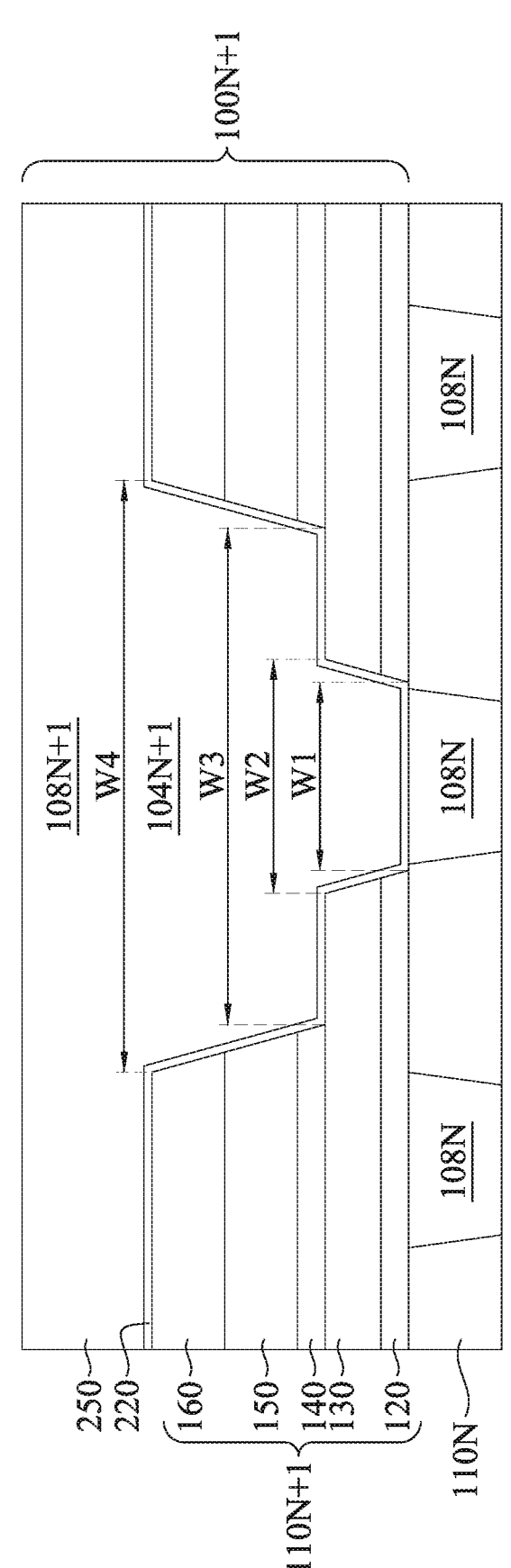
Figure 9D:
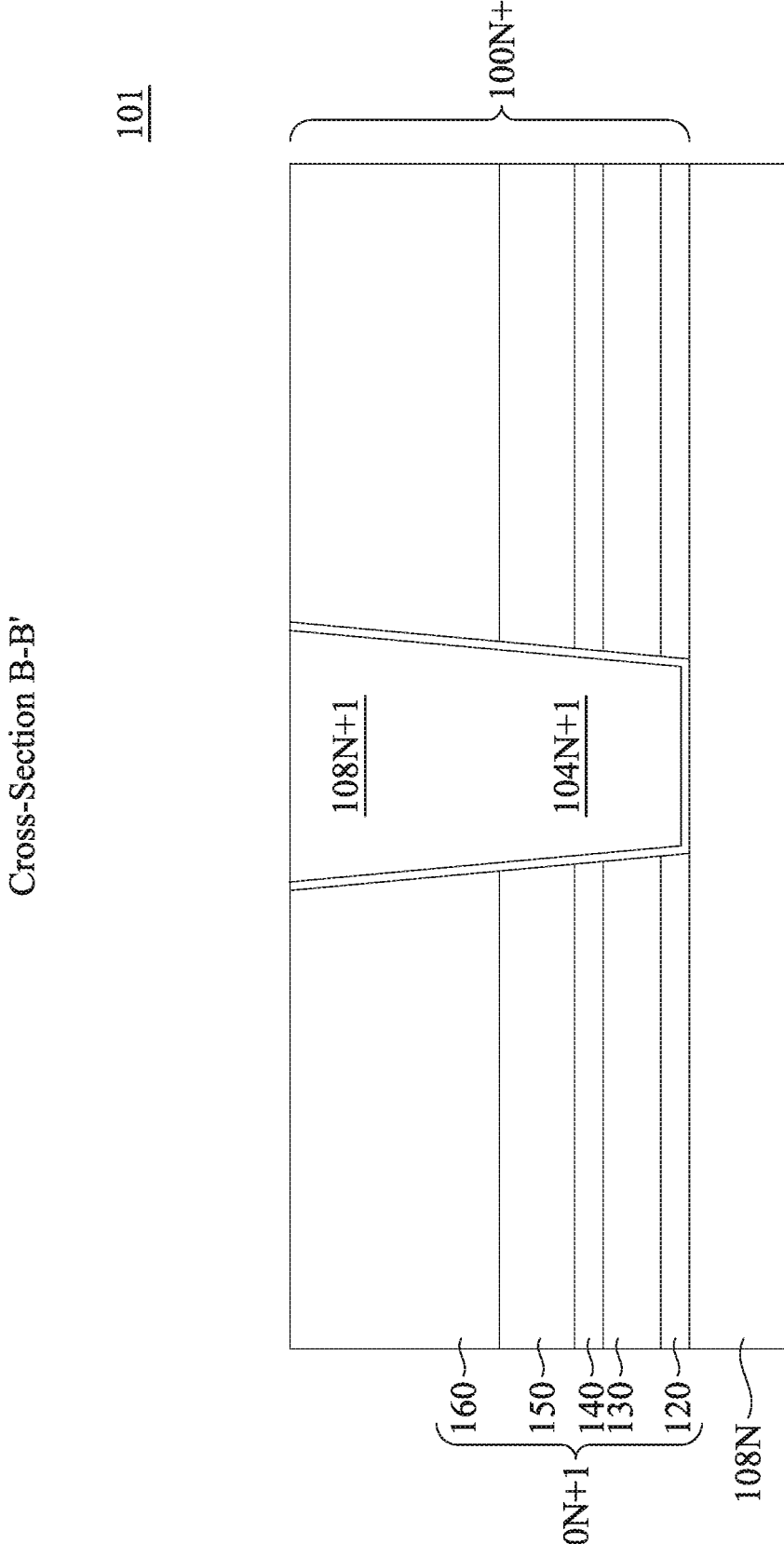
Figure 9E:
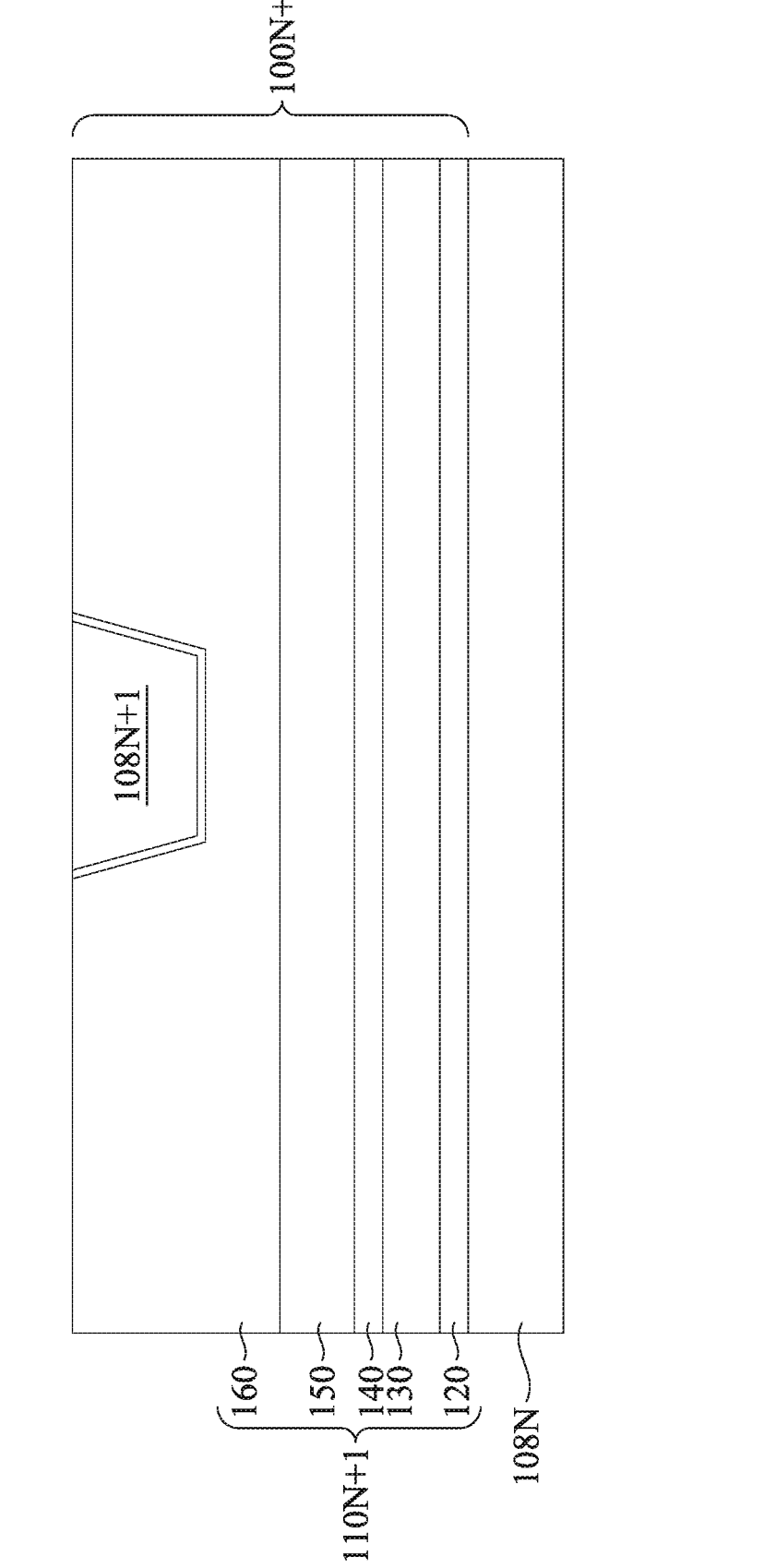

FIGS. 9A through 9E illustrate an (N+1)th interconnect level 100N+1 comprising a conductive via 104N+1 and a conductive line 108N+1 in an IMD layer 110N+1. FIG. 9A illustrates a perspective view of the region 101, FIG. 9B illustrates another perspective view of the region 101 cut along the cross-section A-A', FIG. 9C is illustrated along the cross-section A-A' as illustrated in FIG. 9A, FIG. 9D is illustrated along the cross-section B-B' as illustrated in FIG. 9A, and FIG. 9E is illustrated along the cross-section C-C' as illustrated in FIG. 9A. The IMD layer 110N+1 comprises, e.g., the ESLs 120 and 140 and the dielectric layers 130, 150, and 160. The conductive lines 108N+1 comprise portions of the conductive diffusion barrier liner 220 and the conductive fill material 250 filling the openings 200, and the conductive vias 104N+1 comprise of the conductive diffusion barrier liner 220 and the conductive fill material 250 filling the openings 204 and 214 (see above, FIGS. 6A-C).

A planarizing process (e.g., CMP) may be performed to remove any excess conductive material as well as remaining portions of the hard mask layer 170 (see above, FIGS. 8B-C) over the IMD layer 110N+1, thereby forming a top surface comprising dielectric regions of IMD layer 110N+1 that are substantially coplanar with conductive regions of conductive lines 108N+1. The planarization step completes fabrication of the (N+1)th interconnect level 100N comprising conductive vias 104N+1 and conductive lines 108N+1 embedded in IMD layer 110N+1.

The two step structure of the conductive vias 104N+1 provides an increased via volume, which reduces via resistance while also keeping the contact areas with the underlying conductive lines 108N small, which may reduce bridging defects between adjacent conductive vias. The larger via faceting, e.g. the increased widths W1, W2, W3, and W4, may be beneficial by improving the metal filling of the conductive vias 104N+1, which may provide better connection between interconnect layers.

Figure 10:
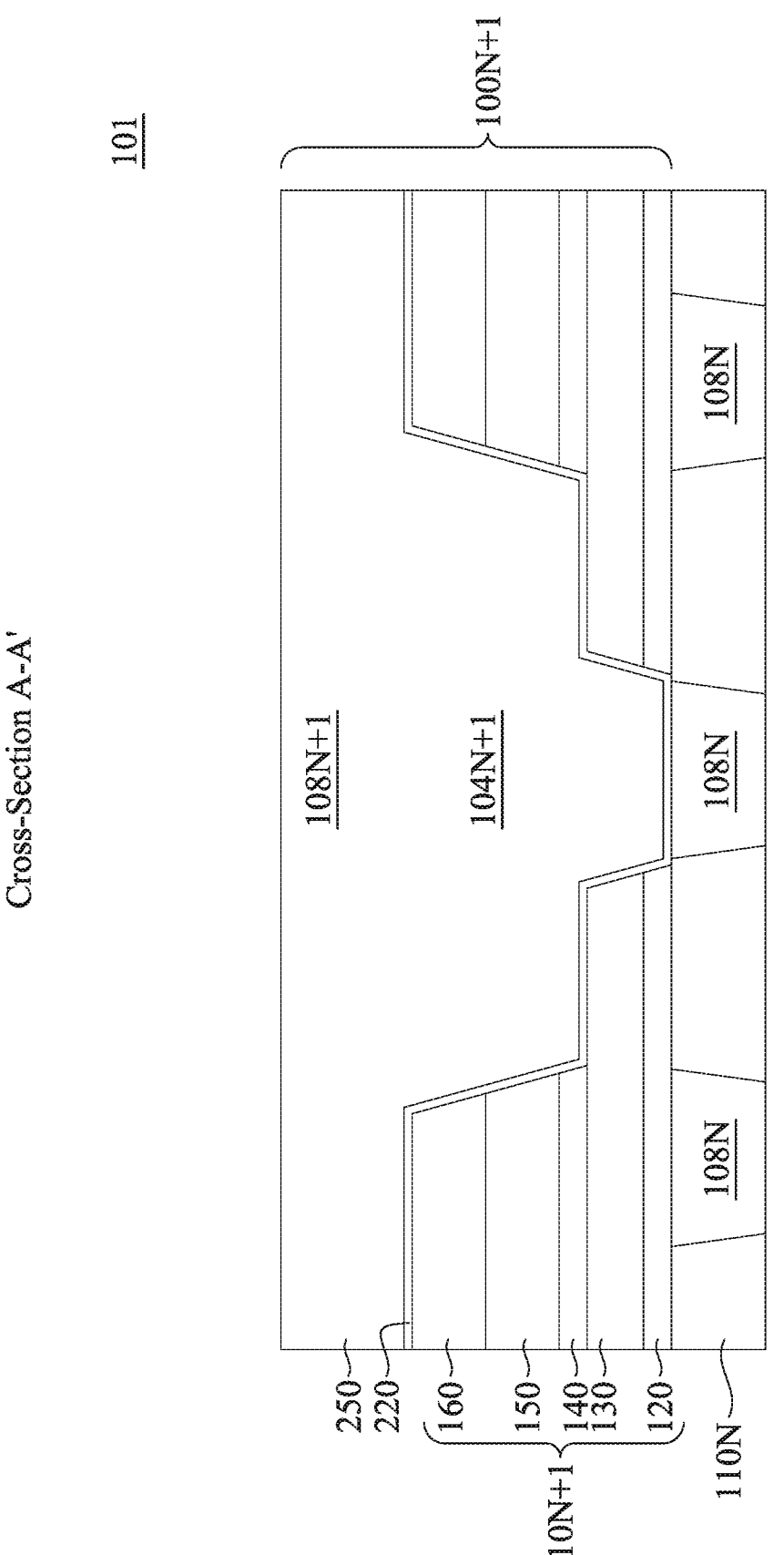
FIGS. 10 through 12 illustrate cross-sectional views of interconnect structures at intermediate stages of manufacturing, in accordance with some embodiments.

FIG. 10 illustrates embodiments following from FIG. 6D and shows the conductive via 104N+1 extending over one or more conductive lines 108N adjacent to the conductive line 108N contacting a bottom surface of the conductive vias 104N+1, in accordance with some embodiments. The conductive via 104N+1 extending over multiple conductive lines 108N may be advantageous for increasing the volume of the conductive via 104N+1, which may lower via resistance and improve the metal filling of the conductive via 104N+1.

Figure 11:
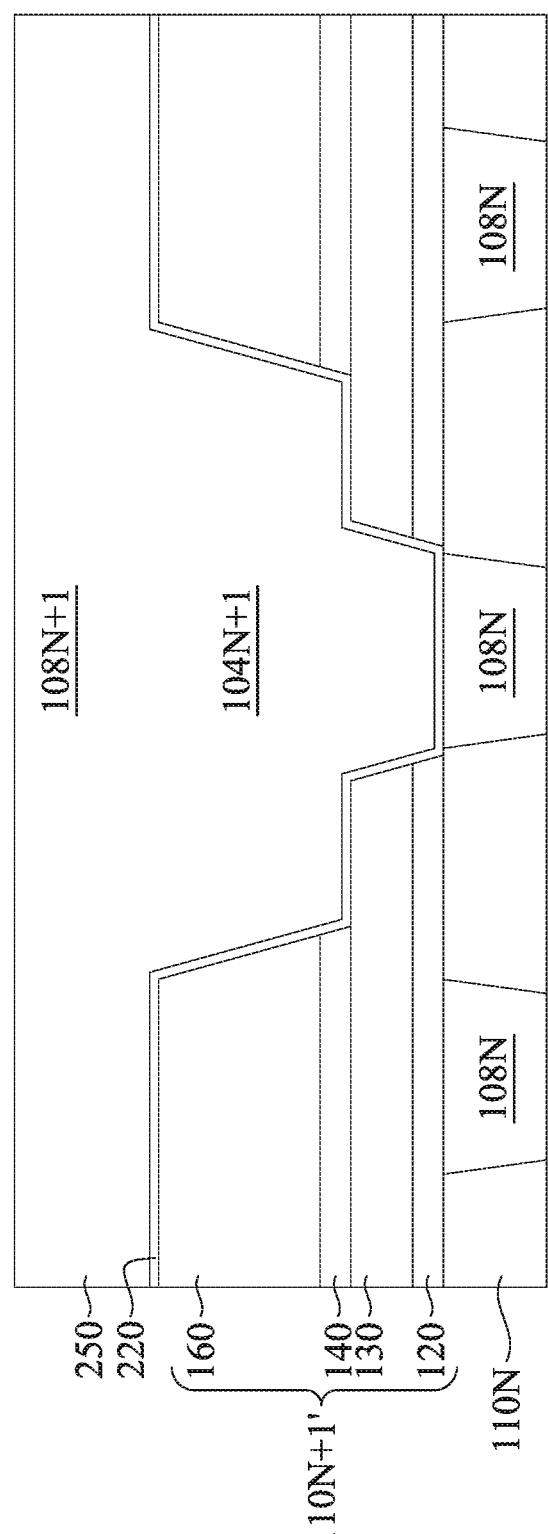
Figure 12:
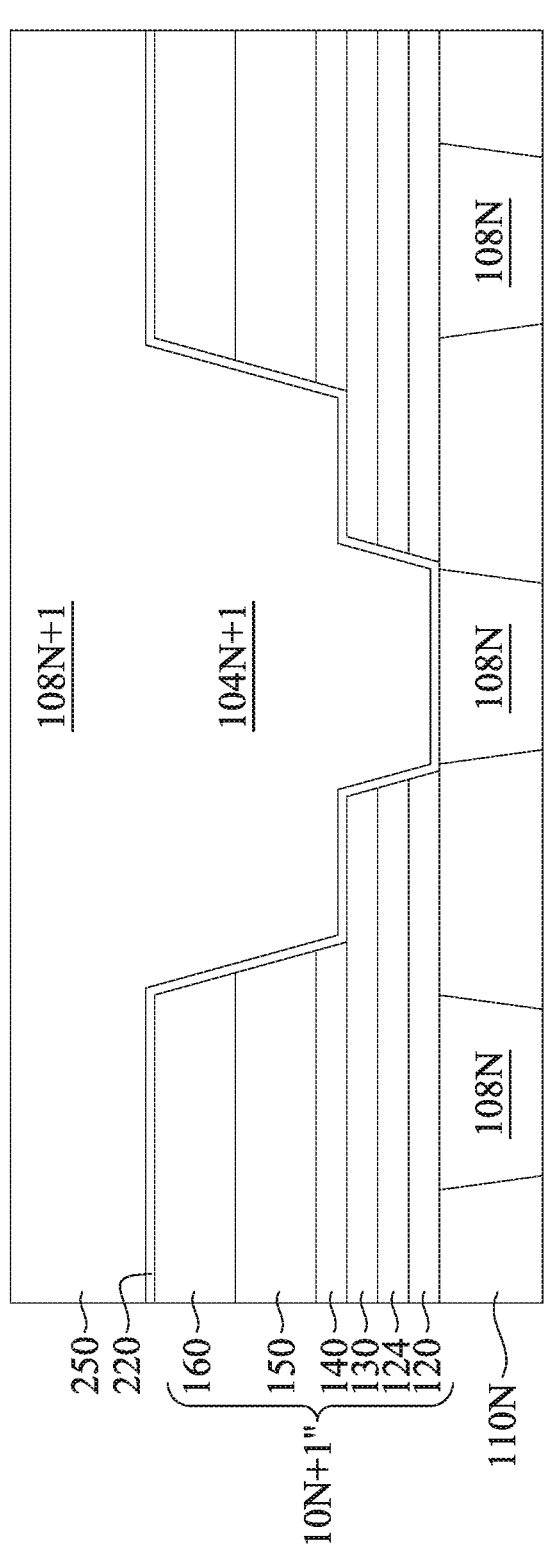

FIGS. 11 and 12 illustrate embodiments following from FIGS. 2C and 2D, respectively. FIG. 11 illustrates an IMD layer 110N+1' comprising the ESLs 120 and 140 and the dielectric layers 130 and 160, and FIG. 12 illustrates an IMD layer 110N+1" the ESLs 120 and 140 and the dielectric layers 124, 130, 150, and 160. The IMD layer 110N+1' may be formed using similar methods as the IMD layer 110N+1 described in respect to FIGS. 3A through 9E but with the dielectric layer 160 being directly on the ESL 140. The IMD layer 110N+1" may be formed using similar methods as the IMD layer 110N+1 described in respect to FIGS. 3A through 9E but with the dielectric layer 124 being between the ESL 120 and the dielectric layer 130.

Embodiments may provide advantages. The via structures disclosed above may provide small contact areas to reduce bridging. The increased widths of the via structures may provide larger via volumes, which may reduce via resistance and improve device performance for advanced technology nodes with smaller via bottom widths. Metal filling of the vias may be improved by larger via faceting to provide better connection between layers.

In accordance with an embodiment, a method includes: forming a first etch stop layer (ESL) over a conductive feature; forming a first dielectric layer on the first ESL; forming a second ESL on the first dielectric layer; forming a second dielectric layer on the second ESL; forming a trench in the second dielectric layer; forming a first opening in a bottom surface of the trench extending through the second dielectric layer; forming a second opening in a bottom surface of the first opening, the second opening extending through the first dielectric layer and the first ESL, the second opening exposing a top surface of the conductive feature, the second opening having a first width; widening the first opening to a second width, the second width being greater than the first width; and filling the trench with a conductive material to form a conductive line and filling the second opening and the first opening with the conductive material to form a conductive via. In an embodiment, widening the first opening includes further etching the second dielectric layer, wherein sidewall portions of the second dielectric layer are removed at a faster rate than top portions of the second dielectric layer. In an embodiment, forming the second opening includes: while further etching the second dielectric layer, etching through the first dielectric layer to expose a portion of the first ESL; and removing the portion of the first ESL. In an embodiment, depositing the second dielectric layer includes: depositing a first dielectric material on the second ESL and depositing a second dielectric material on the first dielectric material, wherein the second dielectric material is different from the first dielectric material. In an embodiment, the first dielectric material is deposited to a thickness in a range of 20 Angstroms to 100 Angstroms. In an embodiment, the method further includes: forming a trench in the second dielectric material, the first opening extending into a bottom surface of the trench; and filling the trench with the conductive material. In an embodiment, the second dielectric material has a thickness measured between a top surface of the first dielectric material and a bottom surface of the trench in a range of 250 Angstroms to 500 Angstroms.

In accordance with another embodiment, a method includes: forming a first opening through a first dielectric layer, the first dielectric layer being on a first etch stop layer (ESL), the first ESL being on a second dielectric layer, the second dielectric layer being on a second ESL, the second ESL being on a first conductive feature; forming a second opening through the first ESL, the second opening extending from a bottom of the first opening; widening the first opening by etching sidewalls of the first dielectric layer; extending the second opening through the second dielectric layer; extending the first opening through the first ESL; extending the second opening through the second ESL; and filling the first opening and the second opening with a conductive material to form a conductive via, the conductive via being coupled to the first conductive feature. In an embodiment, widening the first opening extends the first opening over a second conductive feature, the second conductive feature being under the second ESL adjacent the first conductive feature. In an embodiment, the first ESL is formed to a thickness in a range of 5 Angstroms to 30 Angstroms. In an embodiment, the second dielectric layer is formed to a thickness in a range of 20 Angstroms to 100 Angstroms. In an embodiment, the second ESL is formed to a thickness in a range of 5 Angstroms to 25 Angstroms.

In accordance with yet another embodiment, a structure includes: a first conductive feature in a first dielectric layer; a second dielectric layer over the first dielectric layer; a first etch stop layer (ESL) on the second dielectric layer; a third dielectric layer on the first ESL; a conductive via including: a top portion extending through the third dielectric layer and the first ESL, a bottom surface of the top portion covering a top surface of the second dielectric layer, the top portion having a first width measured across the bottom surface of the top portion; and a bottom portion extending through the second dielectric layer, a bottom surface of the bottom portion landing on a top surface of the first conductive feature, the bottom portion having a second width measured across a top surface of the bottom portion, the second width being smaller than the first width; and a conductive line on the conductive via, sidewalls of the conductive line being covered by the third dielectric layer. In an embodiment, the structure further includes a second conductive feature in the first dielectric layer, wherein the conductive via extends over the second conductive feature. In an embodiment, the structure further includes a second ESL between the first dielectric layer and the second dielectric layer. In an embodiment, the structure further includes a fourth dielectric layer between the second ESL and the second dielectric layer, wherein the second dielectric layer is a first dielectric material, the fourth dielectric layer is a second dielectric material, and the first dielectric material is different from the second dielectric material. In an embodiment, the first width is greater than or equal to 1.4 times the second width. In an embodiment, the top portion has a third width measured across a top surface of the top portion, the third width being greater than or equal to 1.8 times the first width. In an embodiment, the bottom portion has a fourth width measured across a bottom surface of the bottom portion, the first width being greater than or equal to 1.2 times the fourth width. In an embodiment, the bottom portion has a fourth width measured across a bottom surface of the bottom portion, the second width being greater than or equal to 1.25 times the fourth width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a first conductive feature in a first dielectric layer;
a second dielectric layer over the first dielectric layer;
a first etch stop layer (ESL) on the second dielectric layer;
a third dielectric layer on the first ESL;
a conductive via comprising:
   a top portion extending through the third dielectric layer and the first ESL, a bottom surface of the top portion covering a top surface of the second dielectric layer, the top portion having a first width measured across the bottom surface of the top portion; and
   a bottom portion extending through the second dielectric layer, a bottom surface of the bottom portion landing on a top surface of the first conductive feature, the bottom portion having a second width measured across a top of the bottom portion, the second width being smaller than the first width; and
a conductive line on the conductive via, sidewalls of the conductive line being covered by the third dielectric layer.

2. The structure of claim 1, further comprising a second conductive feature in the first dielectric layer, wherein the conductive via extends over the second conductive feature.

3. The structure of claim 1, further comprising a second ESL between the first dielectric layer and the second dielectric layer.

4. The structure of claim 3, further comprising a fourth dielectric layer between the second ESL and the second dielectric layer, wherein the second dielectric layer is a first dielectric material, the fourth dielectric layer is a second dielectric material, and the first dielectric material is different from the second dielectric material.

5. The structure of claim 1, wherein the first width is greater than or equal to 1.4 times the second width.

6. The structure of claim 1, wherein the top portion has a third width measured across a top of the top portion, the third width being greater than or equal to 1.8 times the first width.

7. The structure of claim 1, wherein the bottom portion has a fourth width measured across a bottom of the bottom portion, the first width being greater than or equal to 1.2 times the fourth width.

8. The structure of claim 1, wherein the bottom portion has a fourth width measured across a bottom of the bottom portion, the second width being greater than or equal to 1.25 times the fourth width.

9. A structure, comprising:
a first conductive feature in a first dielectric layer;
a second dielectric layer over the first dielectric layer;
a first etch stop layer (ESL) on the second dielectric layer;
a third dielectric layer on the first ESL;
a conductive line in the third dielectric layer; and
a conductive via extending from the conductive line to the first conductive feature, wherein the conductive line has a greater length than the conductive via, wherein the conductive via has a first portion and a second portion, the first portion extending from the conductive line to the second portion, the second portion extending from the first portion to the first conductive feature, wherein a width of the first portion at an interface between the first portion and the second portion is greater than a width of the second portion at the interface between the first portion and the second portion.

10. The structure of claim 9, wherein the second portion of the conductive via contacts an upper surface of the second dielectric layer.

11. The structure of claim 9, wherein the width of the first portion at the interface between the first portion and the second portion is in a range between 10 nm and 25 nm.

12. The structure of claim 11, wherein a width of the first portion at an interface between the first portion and the first conductive feature is in a range between 8 nm and 20 nm.

13. The structure of claim 11, wherein the width of the second portion at the interface between the first portion and the second portion is in a range between 14 nm and 40 nm.

14. The structure of claim 9, wherein the second dielectric layer has a thickness in a range of 20 Angstroms to 100 Angstroms.

15. The structure of claim 14, further comprising a second ESL between the first dielectric layer and the second dielectric layer, wherein the second ESL has a thickness in a range of 5 Angstroms to 30 Angstroms.

16. A structure, comprising:

a first conductive feature in a first dielectric layer;

a plurality of dielectric layers over the first dielectric layer; and a second conductive feature in the plurality of dielectric layers, the second conductive feature comprising a line portion and a via portion, the line portion being in one or more upper dielectric layers of the plurality of dielectric layers, the via portion being in one or more bottom dielectric layers of the plurality of dielectric layers, wherein the line portion extends laterally beyond edges of the via portion in a first cross-sectional view, wherein the via portion comprises a top via portion and a bottom via portion, the top via portion being adjacent the line portion, the bottom via portion being adjacent the first conductive feature, wherein a bottom surface of the top via portion contacts a top surface of at least one of the plurality of dielectric layers in the first cross-sectional view.

17. The structure of claim 16, wherein sidewalls of the top via portion and the bottom via portion form a single sloped sidewall in a second cross-sectional view, wherein the first cross-sectional view is perpendicular to the second cross-sectional view.

18. The structure of claim 16, wherein a width of the top via portion at an interface between the top via portion and the bottom via portion is greater than or equal to 1.4 times a width of the bottom via portion at the interface between the top via portion and the bottom via portion.

19. The structure of claim 16, wherein a width of the bottom via portion at an interface between the bottom via portion and the first conductive feature is in a range between 8 nm and 20 nm.

20. The structure of claim 19, wherein a width of the top via portion at an interface between the top via portion and the bottom via portion is in a range between 14 nm and 40 nm.

* * * * *